US009691775B1

(12) United States Patent
Licausi et al.

(10) Patent No.: US 9,691,775 B1
(45) Date of Patent: Jun. 27, 2017

(54) COMBINED SADP FINS FOR SEMICONDUCTOR DEVICES AND METHODS OF MAKING THE SAME

(71) Applicant: GLOBALFOUNDRIES Inc., Grand Cayman (KY)

(72) Inventors: Nicholas Vincent Licausi, Watervliet, NY (US); Eric Scott Kozarsky, Malta, NY (US); Guillaume Bouche, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/141,087

(22) Filed: Apr. 28, 2016

(51) Int. Cl.
*H01L 27/11* (2006.01)
*H01L 27/092* (2006.01)
*H01L 27/02* (2006.01)
*H01L 21/8238* (2006.01)
*H01L 21/308* (2006.01)
*H01L 21/3105* (2006.01)
*H01L 21/311* (2006.01)

(52) U.S. Cl.
CPC ...... *H01L 27/1104* (2013.01); *H01L 21/3081* (2013.01); *H01L 21/31051* (2013.01); *H01L 21/31111* (2013.01); *H01L 21/823821* (2013.01); *H01L 27/0207* (2013.01); *H01L 27/0924* (2013.01)

(58) Field of Classification Search
CPC ............. H01L 27/1104; H01L 27/0924; H01L 27/0207; H01L 21/31111; H01L 21/3081; H01L 21/31051; H01L 21/823821
See application file for complete search history.

(56) References Cited

U.S. PATENT DOCUMENTS

| 6,455,436 | B1 | 9/2002 | Ueda et al. |
| 8,298,943 | B1 | 10/2012 | Arnold et al. |
| 8,999,848 | B2 | 4/2015 | Lee et al. |
| 9,012,287 | B2 * | 4/2015 | Liaw .................. H01L 27/1104 438/283 |
| 9,123,656 | B1 | 9/2015 | Hsieh et al. |
| 9,209,279 | B1 * | 12/2015 | Zhang ............... H01L 29/66795 |
| 9,406,775 | B1 | 8/2016 | Bouche et al. |

(Continued)

OTHER PUBLICATIONS

U.S. Appl. No. 15/077,384, filed Mar. 22, 2016, titled Method of Forming a Pattern for Interconnection Lines in an Integrated Circuit (GF Ref. No. HMLT073).

(Continued)

*Primary Examiner* — William Coleman
(74) *Attorney, Agent, or Firm* — Heslin Rothenberg Farley & Mesiti P.C.

(57) ABSTRACT

A semiconductor cell includes a substrate and an array of at least five substantially parallel fins having substantially equal fin widths disposed on the substrate. The array includes a predetermined minimum spacing distance between at least one pair of adjacent fins within the array. The array has a first n-type fin for an n-type semiconductor device, and a first p-type fin for a p-type semiconductor device. The first p-type fin is disposed adjacent the first n-type fin and spaced a predetermined first n-to-p distance apart from the first n-type fin. The first n-to-p distance is greater than the minimum spacing distance and less than the sum of the fin width plus twice the minimum spacing distance.

12 Claims, 23 Drawing Sheets

(56) References Cited

U.S. PATENT DOCUMENTS

| | | |
|---|---|---|
| 2013/0244344 A1 | 9/2013 | Malmhall et al. |
| 2013/0329486 A1 | 12/2013 | Juengling |
| 2014/0054534 A1 | 2/2014 | Pellizzer et al. |
| 2014/0170853 A1 | 6/2014 | Shamma et al. |
| 2014/0258961 A1* | 9/2014 | Ke .................. G06F 17/5072 716/122 |
| 2014/0273464 A1 | 9/2014 | Shieh et al. |
| 2015/0072527 A1 | 3/2015 | Ng et al. |
| 2015/0087149 A1* | 3/2015 | He .................. H01L 21/0338 438/696 |
| 2015/0140811 A1 | 5/2015 | Huang et al. |
| 2015/0147882 A1 | 5/2015 | Yao et al. |
| 2015/0318173 A1 | 11/2015 | Shih et al. |
| 2015/0339422 A1 | 11/2015 | Greco et al. |
| 2016/0049307 A1 | 2/2016 | Chen |
| 2016/0056075 A1 | 2/2016 | Wei et al. |
| 2016/0056104 A1 | 2/2016 | Bouche et al. |
| 2016/0064248 A1 | 3/2016 | Lee et al. |
| 2016/0086841 A1 | 3/2016 | Song et al. |
| 2016/0099178 A1* | 4/2016 | Zhang ............... H01L 21/02532 438/478 |
| 2016/0254191 A1* | 9/2016 | Tseng .............. H01L 21/823431 |

OTHER PUBLICATIONS

U.S. Appl. No. 15/077,480, filed Mar. 22, 2016, titled Method of Forming a Pattern for Interconnection Lines and Associated Continuity Blocks in an Integrated Circuit (GF Ref. No. HMLT085).
U.S. Appl. No. 15/077,564, filed Mar. 22, 2016, titled Method of Forming Self Aligned Continuity Blocks for Mandrel and Non-Mandrel Interconnect Lines (GF Ref. No. HSC026).
U.S. Appl. No. 15/379,605, filed Dec. 15, 2016.
U.S. Appl. No. 15/271,475, filed Sep. 21, 2016.
U.S. Appl. No. 15/271,497, filed Sep. 21, 2016.
U.S. Appl. No. 15/053,818, filed Feb. 25, 2016.
U.S. Appl. No. 15/379,645, filed Dec. 15, 2016.
U.S. Appl. No. 15/379,707, filed Dec. 15, 2016.
U.S. Appl. No. 15/379,740, filed Dec. 15, 2016.
U.S. Appl. No. 15/362,035, filed Nov. 28, 2016.
U.S. Appl. No. 15/271,519, filed Sep. 21, 2016.

* cited by examiner

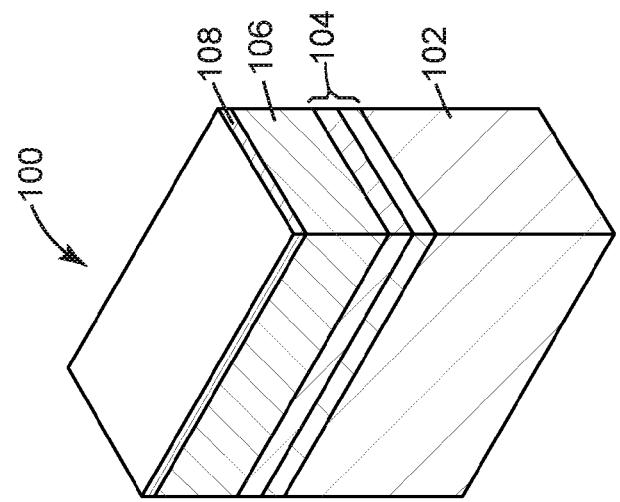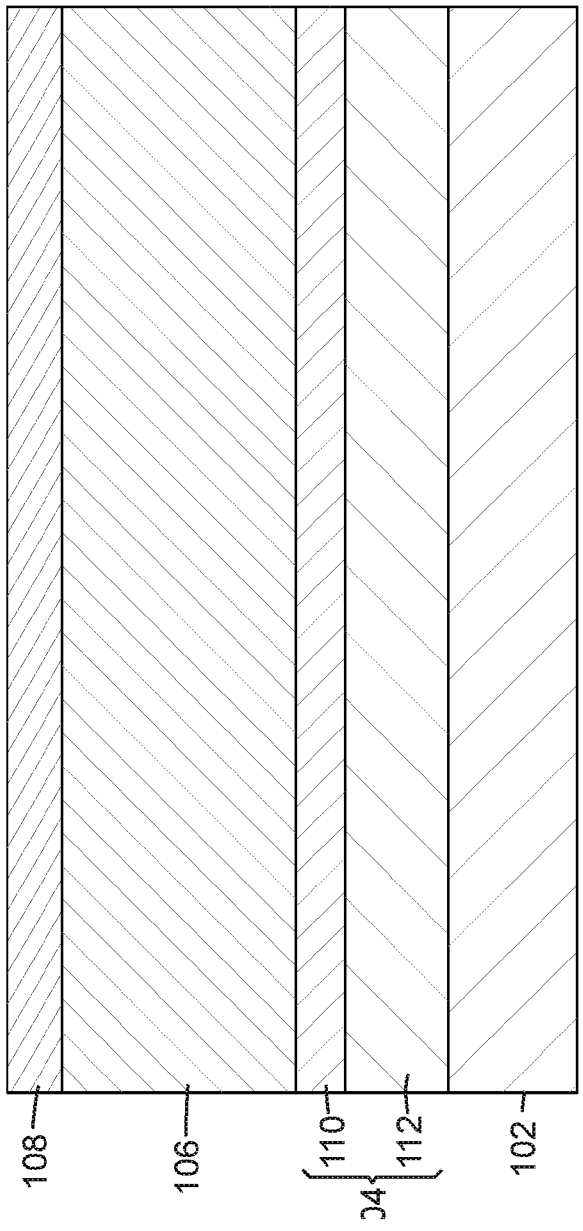

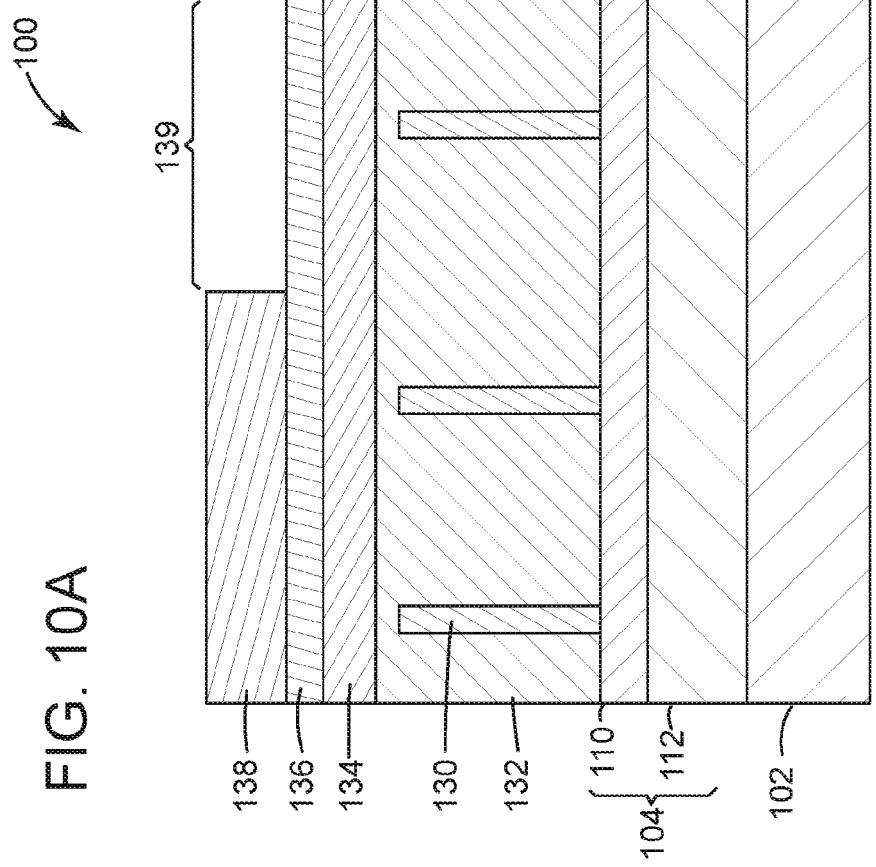
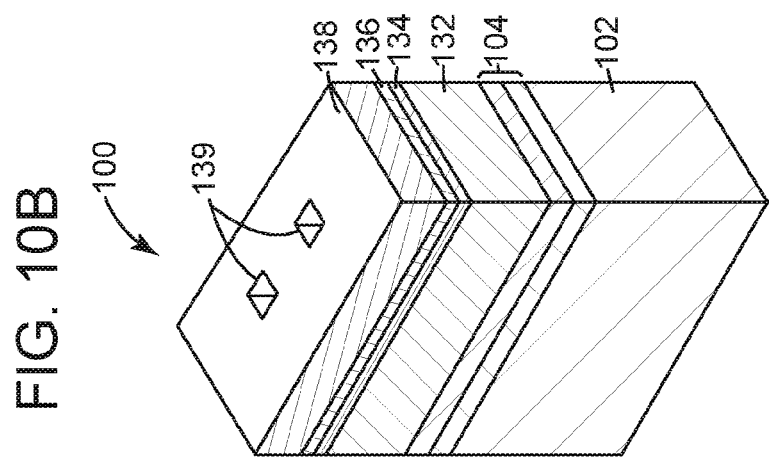
FIG. 10A
FIG. 10B

COMBINED SADP FINS FOR SEMICONDUCTOR DEVICES AND METHODS OF MAKING THE SAME

TECHNICAL FIELD

The present invention relates to semiconductor devices and methods of fabricating the same. More specifically, the invention relates to combined self-aligned double patterning fins for semiconductor devices and methods of making the same.

BACKGROUND

Technologies for fabricating semiconductor devices, such as transistors, capacitors and the like, for ultra-high density integrated circuits have been developed which extend patterning resolution beyond that of conventional lithography (which is typically limited to about 80 nm pitch). Self-aligned multiple patterning is one such class of high resolution patterning technologies. The current state of the art multiple patterning technology contemplated for commercial production is a method known as Self-Aligned Quadruple Patterning (SAQP), which is an extrapolation of the more commonly commercially used Self-Aligned Double Patterning (SADP) technique.

Problematically, the theoretical minimum regular pitch for SAQP is about 20 nanometers (nm) using conventional lithographic techniques. Moreover, variable pitch, or variable spacing between fins in a Fin Field Effect Transistor (FinFET), is very difficult to achieve with SAQP. This is particularly the case when the pitch (i.e., the distance between repetitive features in a semiconductor device structure) is less than or equal to 32 nm. More specifically, achieving variable spacing with conventional SAQP between fins within an array of five fins or more is increasingly difficult when the spacing between fins is equal to or less than 24 nm.

This lack of variability can be very problematic in the fabrication of a variety of semiconductor devices that utilize fin arrays having both n-type and p-type fins. This is because the minimum spacing distance between an n-type fin and a p-type fin (the n-to-p spacing distance) is necessarily larger than the distance between a pair of n-type fins, therefore requiring that the fin array either have some degree of variability or become unnecessarily large in size. One such class of devices requiring both n-type and p-type FinFETs are static random access memory (SRAM) cells and other similar logic cells.

Accordingly, there is a need for a method of fabricating semiconductor devices that can achieve a more variable pitch utilizing standard lithography. There is a need to be able to apply this technology to semiconductor devices having a fin pitch of 32 nm or less and to a fin spacing of 24 nm or less. There is a specific need to be able to apply this technology to the fabrication of SRAM cells. Additionally, there is a need for a method of fabricating semiconductor devices that can achieve a pitch of 20 nm or lower.

Furthermore, there is substantial need for the ability to cut a single fin in a sea of fins without damaging neighboring fins. As fin pitch scales, this is especially challenging for pitches of roughly 32 nm or less.

BRIEF DESCRIPTION

The present invention offers advantages and alternatives over the prior art by providing a semiconductor cell or similar structure and method of making the same. The fabrication of the semiconductor cell can achieve a more variable spacing between fins in an array using standard lithography even when fin spacing is 24 nm or less or the fin array is large. Additionally, the present invention enables cutting fins in fin arrays of three fins or more. This is enabled by a sequential fin formation and cut process which can be employed for both SRAM-type cells and random logic cells.

A semiconductor cell in accordance with one or more aspects of the present invention includes a substrate and an array of at least five substantially parallel fins having substantially equal fin widths disposed on the substrate. The array includes a predetermined minimum spacing distance between at least one pair of adjacent fins within the array. The array also includes a first n-type fin for an n-type semiconductor device, and a first p-type fin for a p-type semiconductor device. The first p-type fin is disposed adjacent the first n-type fin and spaced a predetermined first n-to-p distance apart from the first n-type fin. The first n-to-p distance is greater than the minimum spacing distance and less than the sum of the fin width plus twice the minimum spacing distance.

A method in accordance with one or more aspects of the present invention includes providing a structure, the structure including a hardmask layer disposed over a substrate and a first mandrel layer disposed over the hardmask layer. An array of first mandrels is patterned into the first mandrel layer. An array of first spacers is formed on sidewalls of the first mandrels. A pattern layer is disposed over the array of first spacers, an etch stop layer is disposed over the pattern layer and a second mandrel layer is disposed over the etch stop layer. An array of second mandrels is patterned into the second mandrel layer. An array of second spacers is formed on sidewalls of the second mandrels. The array of second spacers is etched into the pattern layer such that the second spacers are combined with the first spacers, the first and second spacers forming a pattern for an array of fins disposed on the hardmask layer. The pattern is etched into the substrate to form the array of fins.

DRAWINGS

The invention will be more fully understood from the following detailed description taken in conjunction with the accompanying drawings, in which:

FIG. 4A is a side view of an initial stack of layers for a structure, the structure including a substrate, hardmask layer, first mandrel layer and first etch stop layer, in accordance with the present invention;

FIG. 4B is a perspective view of FIG. 4A in accordance with the present invention;

FIG. 10A is a side view of FIG. 9 having a first planarization layer, a second etch stop layer and a second photo resist layer disposed thereon, wherein a targeted section of the second etch stop layer is exposed in accordance with the present invention;

FIG. 10B is a perspective view of FIG. 10A in accordance with the present invention;

DETAILED DESCRIPTION

Figure 1A:
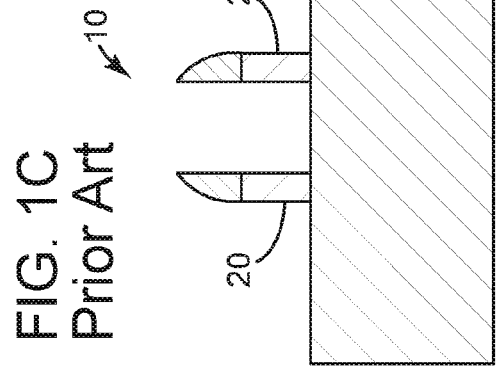
FIG. 1A is a side view of an exemplary embodiment of a prior art SAQP method of manufacturing a semiconductor structure in an intermediate stage of manufacture, the structure having a first spacer layer conformally disposed over an array of lithographically patterned mandrels.

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1A-1F illustrate a typical prior art SAQP method of semiconductor fabrication. FIG. 2 illustrates a typical prior art SRAM cell including n-type, p-type fins and dummy fins.

Referring to FIGS. 1A-1F, an exemplary embodiment of a prior art sequential method of SAQP fabrication is illustrated. Starting with FIG. 1A, a structure 10, in an intermediate stage of manufacture, has a first spacer layer 12 conformally disposed over an array of lithographically patterned mandrels 14 having a predetermined line density and pitch. In this exemplary embodiment, the mandrels are disposed over a hardmask layer 16 and the hardmask layer 16 is disposed over a substrate 18.

Figure 1B:
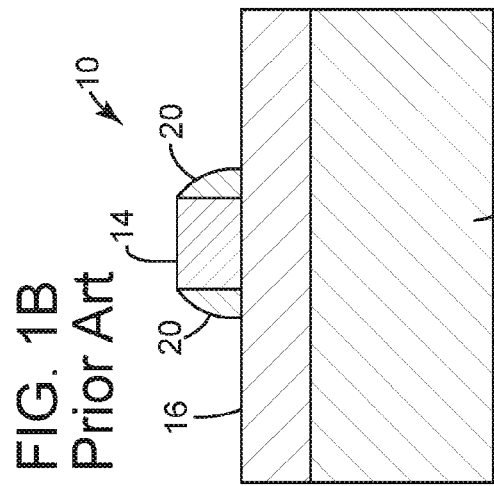
FIG. 1B is a side view of prior art FIG. 1A with first spacers formed on sidewalls of the mandrels.
Figure 1C:
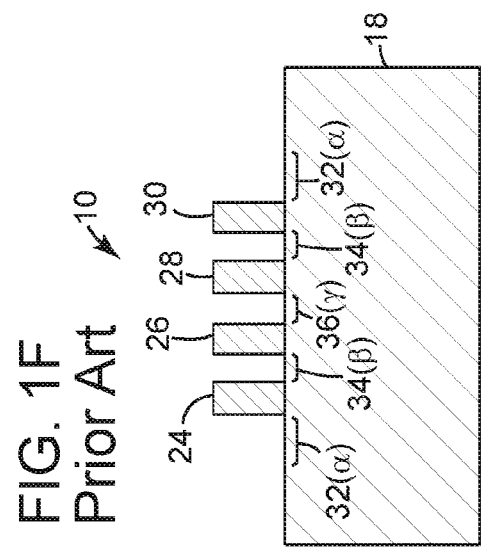
FIG. 1C is a side view of prior art FIG. 1B with the mandrel removed.
Figure 1E:
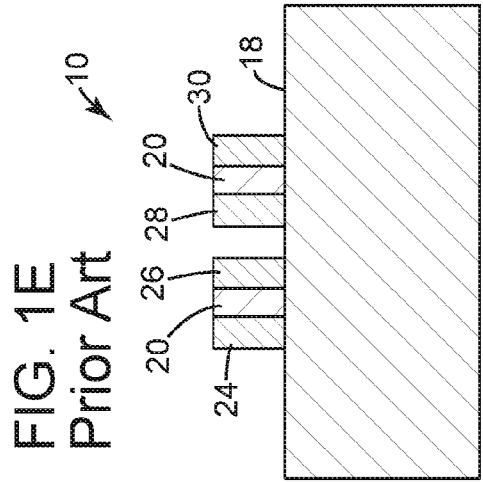
FIG. 1E is a side view of prior art FIG. 1D with second spacers formed on sidewalls of the first spacers.
Figure 1F:
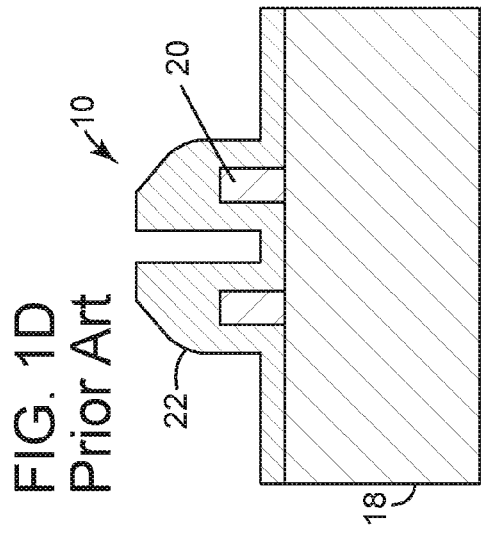
FIG. 1F is a side view of prior art FIG. 1E with the first spacers removed.
Figure 2:
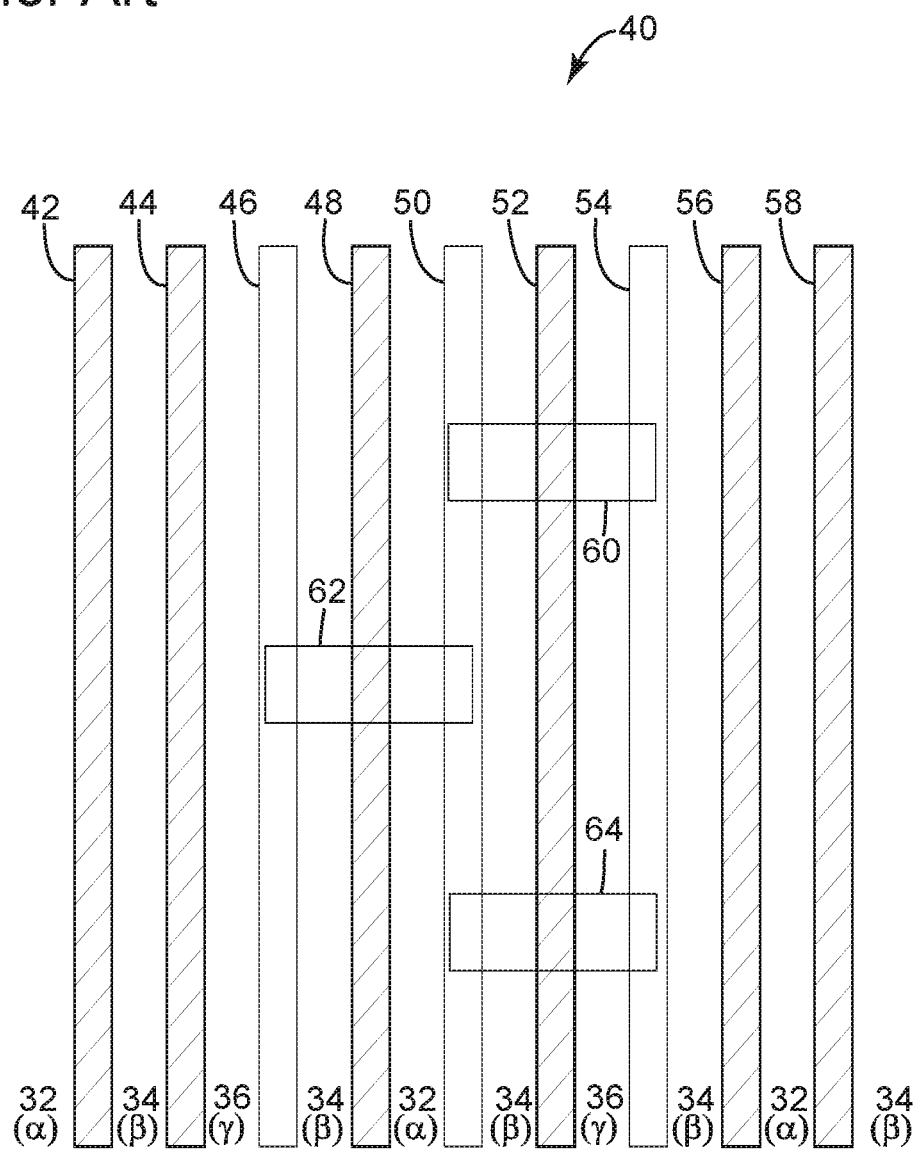
FIG. 2 is a top view of a prior art SRAM cell.

Referring to FIG. 1B, the first spacer layer 12 is then anisotropically etched to form a first array of first spacers 20 on the sidewalls of the mandrels 14. Referring to FIG. 1C, the mandrels 14 are then removed and the first array of spacers 20 are anisotropically etched into the hardmask layer 16. Up to this point, the process flow has been that of a typical SADP process. Since there are two spacers 20 for each mandrel 14, the line density has doubled and the pitch cut in half.

Figure 1D:
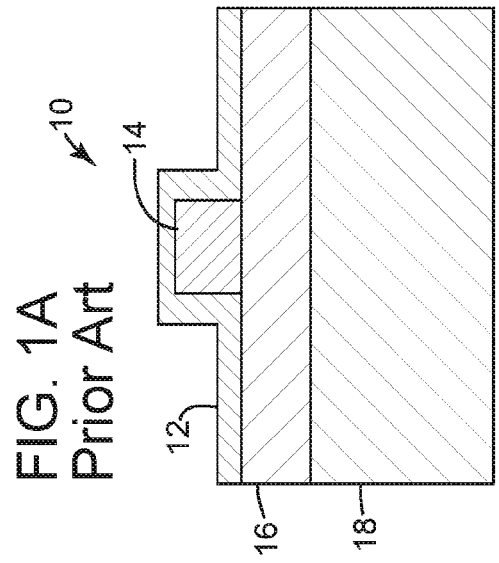
FIG. 1D is a side view of prior art FIG. 1C with a second spacer layer conformally coating the first spacers.

Starting with FIG. 1D, the first part of the SAQP process flow is repeated over the first array of spacers 20. That is, a second spacer layer 22 is disposed over the first array of spacers 20. Then, referring to FIG. 1E, the second spacer layer 22 is anisotropically etched to form a second array of spacers 24, 26, 28 and 30. Finally, referring to FIG. 1F, the first array of spacers 20 are then removed, leaving only the second array of spacers 24-30, which will be used as a pattern to etch fins into the substrate 18. Since there are now four spacers 24-30 for each mandrel 14, the line density has quadrupled and the pitch has been quartered from that of the original mandrels 14.

It is important to note that the width of the mandrels 14 and the spacing between mandrels are the only two variable parameters in an SAQP process. The thickness of the first and second spacer layers 12 and 22 cannot be locally adjusted during the deposition process and are not considered variable parameters across a wafer. As such, the spacing 32 on either side of the group of four spacers 24-30, herein referred to as the alpha space ($\alpha$), is variable because it is controlled by the spacing between the mandrels 14. Additionally, the spacing 36 between spacers 26 and 28, herein referred to as the gamma space ($\gamma$), is also variable because it is controlled by the width of the mandrels 14. However, the pair of spaces 34 located between spacers 24 and 26 as well as between spacers 28 and 30, herein referred to as the beta spaces (β), are rigidly fixed.

Accordingly, every other space is a fixed beta space 34 in any array of fins produced by an SAQP process. This rigidity becomes more problematic as an array of fins gets large in number (e.g., many thousands or more) and smaller in size (e.g., below 24 nm spacing between fins). As a result, prior art cells of semiconductor devices have arrays of fins that are typically formed equal distance apart. If variability is required between fins (e.g., such as when an n-type fin is adjacent a p-type fin), then sacrificial dummy fins are generally inserted and later removed during fabrication. However, the use of such sacrificial dummy fins make the prior art cells grow unnecessarily large in size.

Referring to FIG. 2, an exemplary embodiment of a typical prior art SRAM cell 40 fabricated using a conventional SAQP process is illustrated. SRAM cells in general are random access memory cells that retain data bits in there memory as long as power is being supplied. SRAM is typically used in personal computers, workstations, routers, peripheral equipment and the like.

SRAM cell 40 includes four n-type fins 42, 44, 56 and 58 for four n-type FinFETs (herein nFETs). SRAM cell 40 also includes two p-type fins 48 and 52 for two p-type FinFETs (herein pFETs). As will be explained in greater detail herein, fins 46, 50 and 54 are sacrificial dummy fins that will be removed prior to the formation of the FinFETs.

Each bit in SRAM cell 40 is stored in the two nFET/pFET adjacent pairs associated with the two n-type/p-type adjacent fins 44, 48 and 52, 56 respectively, wherein the FinFETs are interconnected together to form a pair of cross-coupled inverters. The remaining two nFETs associated with the remaining two n-type fins 42, 58 serve to control access to the inverters during read and write operations.

One skilled in the art would recognize that there are several other possible configurations of SRAM cells having various interconnected combinations of nFETs and pFETs. However, each SRAM cell must have at least one nFET adjacent one pFET, which are spaced a predetermined n-to-p distance apart.

In this exemplary embodiment, the fins 42-58 have a constant fin width of 8 nm (within a tolerance of plus or minus 4 nm or less) and are equally spaced a distance of 24 nm to provide an average pitch of 32 nm. Because the fins 42-58 are spaced at such a small distance apart, an SAQP process is used to fabricate them. As a result, every other space separating the fins 42-58 is a fixed beta space 34. Additionally, the alpha 32 and gamma 36 spaces alternate between the fixed beta spaces 32. As such, for any array of at least five substantially parallel fins (for example fins 42-50, fins 46-54 or fins 50-58) there will be at least two fixed beta spaces 34 to one alpha space 32 and one gamma space 36.

Because of the rigidity introduced by the fixed beta spaces 34, plus the difficulty in adjusting the alpha 32 and gamma 36 spaces at such small scales, and the added complexity of logically integrating a large number of such SRAM cells with many other devices throughout an ultra-high density integrated circuit, it is simply not cost effective or technically feasible to fabricate variably spaced SRAM cells using conventional SAQP methods. Moreover, even though the rigidity introduced by the fixed beta spaces 34 becomes significant for arrays of at least five parallel fins, where each different type of alpha 32, beta 34 and gamma 36 spaces are present, the rigidity grows rapidly as the number of fins in the array increases above 5. As a result, the fins 42-58 are fabricated with an equal width and are spaced equal distances apart throughout the entire SRAM cell 40.

However, due to structural differences between dopant types and epitaxial source/drain regions associated with an n-type and p-type FinFET, the minimum distance required for functionality between an n-type fin and an adjacent p-type fin will always be greater than the minimum distance required between a pair of n-type fins. Therefore, in order to introduce some sort of variable spacing between fins within the SRAM cell 40, dummy fins 46 and 54 are disposed between each n-type/p-type fin combination (44, 48 and 52, 56) at an intermediate stage of processing. Therefore the n-to-p distance between each n-type/p-type fin pair can be made larger than the minimum spacing distance associated with a pair of n-type fins by simply removing the dummy fins. More specifically, once the dummy fins 46 and 54 are removed, the n-to-p distance will be equal to or greater than the sum of the fin width (in this case 8 nm) plus twice the minimum spacing distance (in this case 24 nm) in the SRAM cell 40.

In addition to a requirement for variability of fin spacing due to the structural differences between n-type and p-type fins, there is also an equally important need for variability of fin spacing due to lateral cuts 60, 62 and 64 that often have to be made on the p-type fins of SRAM cell 40. However, lithographic tolerances makes patterning cuts in fins at such small sizes impossible to reliably accomplish without clipping adjacent fins. As such, a dummy fins (in this case fin 50) are also inserted between any p-type pair of fins (in this case fins 48 and 52).

Therefore, in the case of SRAM cell 40, for the six active fins 42, 44, 48, 52, 56 and 58 of the cell, there are three dummy fins 46, 50 and 54 required to allow for n-type to p-type fin structural differences and to allow for cutting of the p-type fins without clipping adjacent fins. Problematically, the use of dummy fins 46, 50 and 54 increases the number of fins and the overall size of the SRAM cell 40 by as much as 50 percent. There is, therefore, a need to provide a method that can achieve variability between n-type to p-type fin pairs, p-type fin pairs and n-type fin pairs without the use of dummy fins. This need is particularly acute in SRAM cells or similar.

FIGS. 3-23 illustrate various exemplary embodiments of a method and apparatus of making a variable spacing semiconductor cell or similar structure in accordance with the present invention. The invention provides more variable parameters than a conventional SAQP process, therefore achieving variability of spacing within a fin array in a cost effective and technically feasible manner. More specifically, the invention does not require the use of dummy fins to achieve variability. Additionally, the invention can be applied to arrays of 5 fins or more, having a minimum fin spacing of 24 nm or less and/or a minimum pitch of 32 nm or less.

Figure 3:
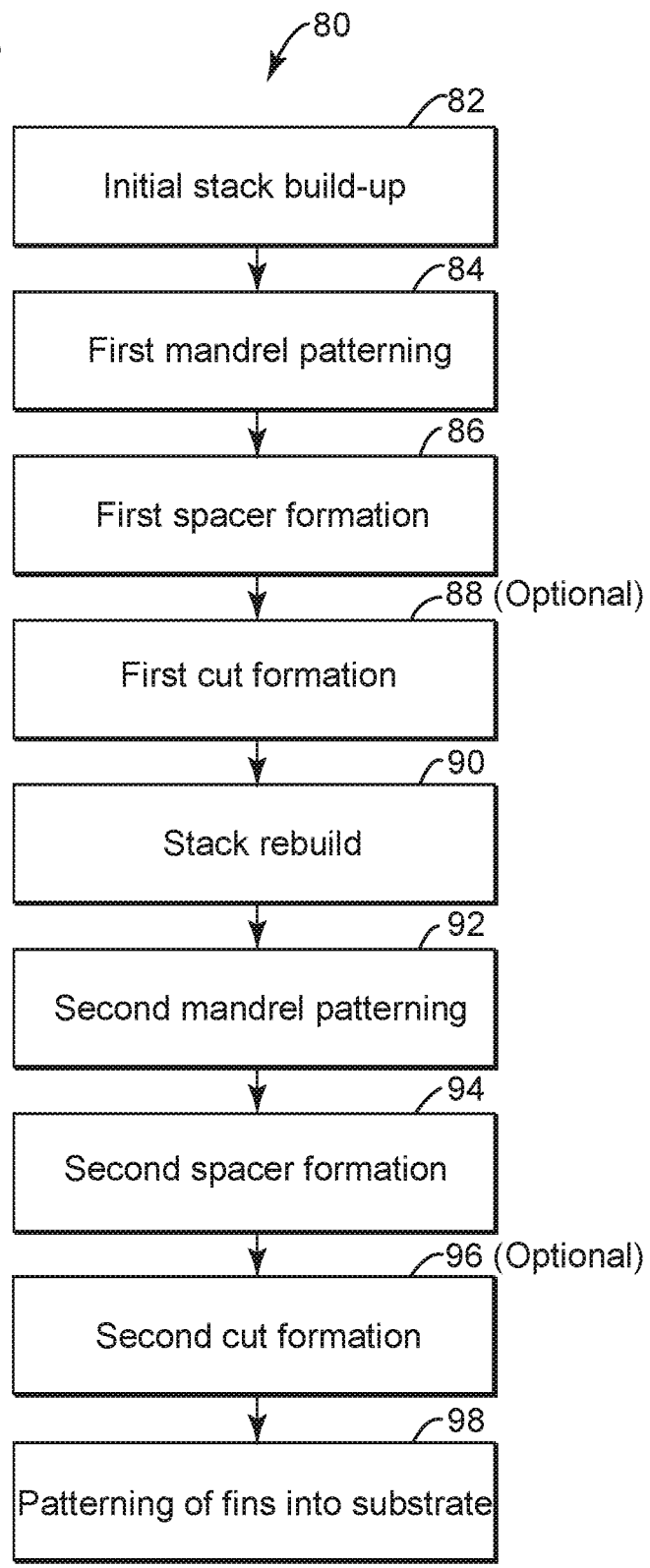
FIG. 3 is a module flow diagram of a method to form a variable spacing semiconductor cell or similar structure in accordance with the present invention.

Referring to FIG. 3, an exemplary embodiment of a high level overview of a method and apparatus utilized to form a variable spacing semiconductor cell in accordance with the present invention is illustrated in module flow diagram 80. Module flow diagram 80 includes nine separate modules, 82, 84, 86, 88, 90, 92, 94, 96 and 98, wherein each module includes several method steps which will be detailed herein. Briefly the modules may be described as follows:

Module 82: Initial stack build-up. (Includes steps illustrated in FIGS. 4A and 4B): In this module a structure 100 is provided. The structure 100 includes at least a hardmask layer 104 disposed over a substrate 102 and a first mandrel layer 106 disposed over the hardmask layer 104.

Module 84: First mandrel patterning. (Includes steps illustrated in FIGS. 5-6): In this module an array of first mandrels 118 is patterned into the first mandrel layer 106.

Module 86: First spacer formation. (Includes steps illustrated in FIGS. 7-9): In this module an array of first spacers is formed on sidewalls of the first mandrels.

Module 88 (optional): First cut formation. (Includes steps illustrated in FIGS. 10A-11): This module includes the disposition of a first planarization layer over the array of first spacers. The first planarization layer is then patterned to expose at least a selected first spacer of the array of first spacers. A first cut is then etched into the exposed first spacer.

Module 90: Stack rebuild. (Includes steps illustrated in FIG. 12): This module includes the deposition of a pattern layer over the array of first spacers. An etch stop layer is disposed over the pattern layer. A second mandrel layer is disposed over the etch stop layer Module 92: Second mandrel patterning. (Includes steps illustrated in FIG. 13-14): This module includes the patterning of an array of second mandrels into the second mandrel layer.

Module 94: Second spacer formation. (Includes steps illustrated in FIGS. 15-17): The module includes the formation of an array of second spacers on sidewalls of the second mandrels.

Module 96 (optional): Second cut formation. (Includes steps illustrated in FIGS. 18A-19): This module includes the disposition of a second planarization layer over the array of second spacers. The second planarization layer is then patterned to expose at least a selected second spacer of the array of first spacers. A second cut is then etched into the exposed second spacer.

Module 98: Patterning of fins into substrate. (Includes steps illustrated in FIGS. 20-23): This module includes the etching of the array of second spacers into the pattern layer such that the second spacers are combined with the first spacers, wherein the first and second spacers form a pattern for an array of fins disposed on the hardmask layer 104. The pattern is then etched into the substrate 102 to form the array of fins.

Module 82: Initial Stack Build-Up. (FIGS. 4A and 4B)

This Module Details the Build-Up of the Initial Stack of Layers in Structure 100, Including the Mandrel Layer 106

Referring to FIGS. 4A and 4B, a simplified view of an exemplary embodiment of a semiconductor cell structure 100 for an integrated circuit device in accordance with the present invention is presented at an intermediate stage of manufacturing. Semiconductor cell structure 100 includes a substrate 102 having a hardmask layer 104 disposed thereon. A first mandrel layer 106 is disposed over the hardmask layer 104 and a first etch stop layer 108 may be disposed over the first mandrel layer 106.

The substrate 102 may be composed of any appropriate semiconductor material such as silicon, silicon germanium or the like. The hardmask layer 104 is required to etch an array of fins (not shown) into the substrate 102. Though at least one hardmask layer 104 is required, the hardmask layer 104 may be composed of several layers. In this exemplary embodiment the hardmask layer 104 is composed of a first hardmask sublayer 110 and a second hardmask sublayer 112. The first hardmask sublayer 110 can be a silicon dioxide (SiO2) or similar. The second hardmask sublayer 112 may be a silicon nitride (SiN) or similar, which is deposited by a low pressure chemical vapor deposition (LPCVD) process.

The first mandrel layer 106 may be a spin-on hardmask (SOH) material such as an amorphous carbon (aC) or amorphous silicon (aSi). The first etch stop layer 108 may be a silicon oxynitride (SiON) or similar.

Module 84: First Mandrel Patterning. (FIGS. 5-6)

This Module Details the Steps Required to Pattern an Array of First Mandrels 118 into the Mandrel Layer 106

Figure 5:
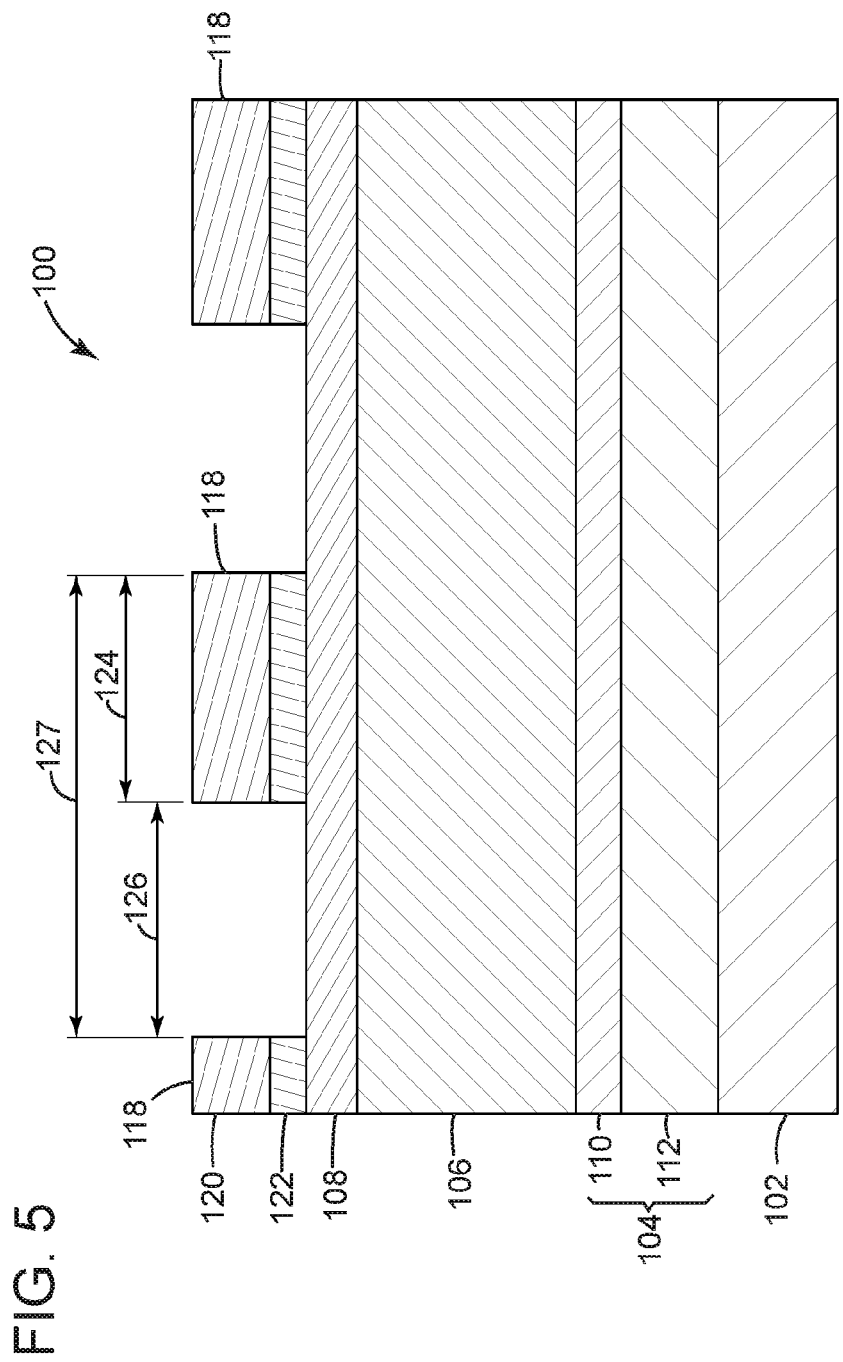
FIG. 5 is a side view of FIG. 4B having first mandrels patterned into a first photo resist layer in accordance with the present invention.
Figure 6:
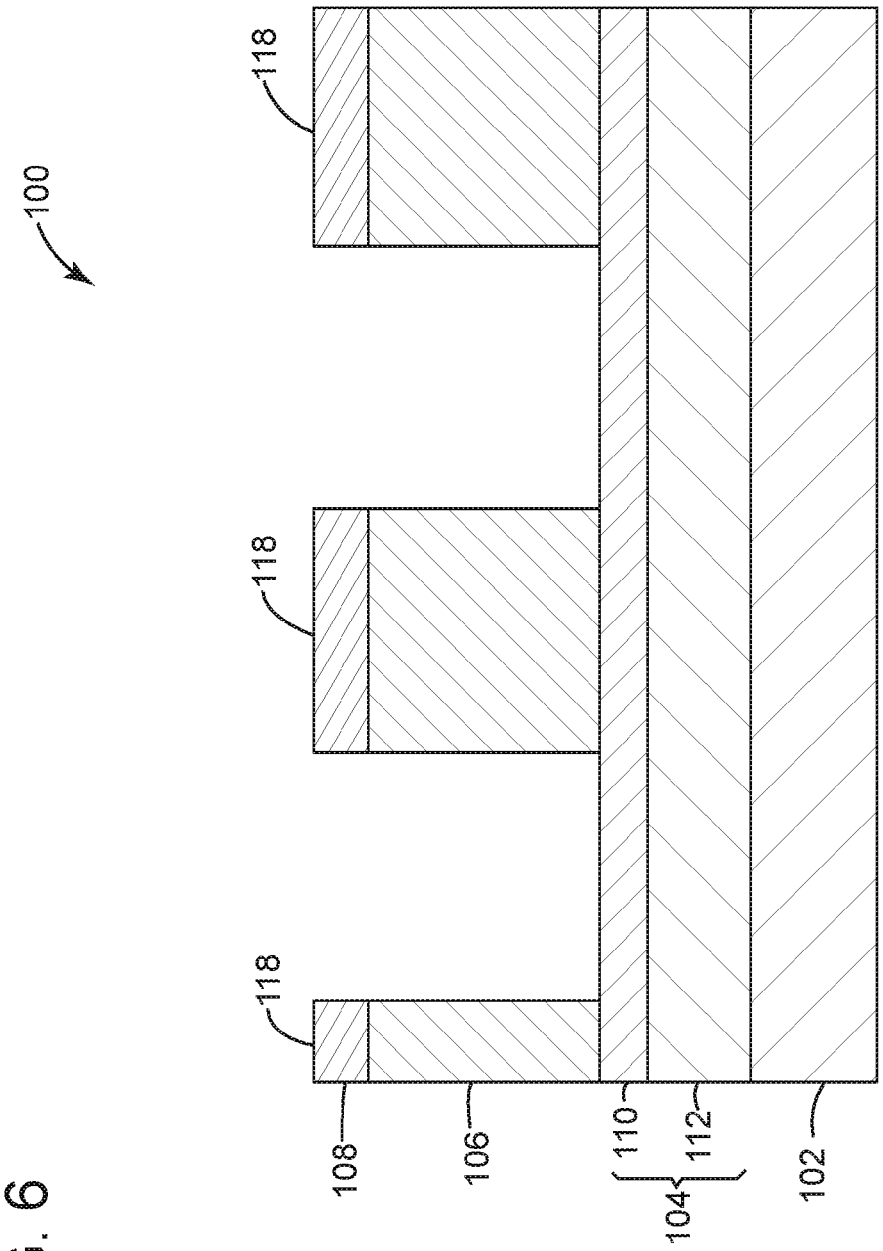
FIG. 6 is a side view of FIG. 5 having the first mandrels etched into the first mandrel layer in accordance with the present invention.

Referring to FIG. 5, at least a first photo resist layer 120 is disposed over the first etch stop layer 108. More than likely, however, a first bottom antireflective coating (BARC) layer 122 is disposed over the first etch stop layer 108 and the first photo resist layer 120 is disposed over the first BARC layer 122. The first mandrels 118 are then patterned into the first photo resist layer 120 through well-known lithographic techniques.

In this embodiment, the first mandrels have a first mandrel width 124 of 64 nm and a first mandrel spacing 126 of 64 nm for an average pitch 127 of 128 nm. However, it is important to note that the first mandrel width 124 and spacing 126 are variable parameters that can be used to control variable spacing within a fin array of a semiconductor cell. As such, the mandrels 118 do not have to be equally spaced or have equal widths.

Referring to FIG. 6, next the first mandrels 118 are anisotropically etched from the first photo resist layer 120 into the first mandrel layer 106. The anisotropic etching process can be a reactive ion etching process. For purposes of clarity, any feature herein, such as a spacer, mandrel of the like, that is etched down from an original feature will be referred to as such original feature if it has the same form and function as the original feature. However, it is well-known that the etched down feature will be a translation of the original feature and will be composed of remnants of the various layers involved in the etching process. More specifically, in the case of the first mandrels 118, the original first mandrels 118 were etched into and composed of resist layer 120 and BARC layer 122. However, the etched down first mandrels 118 may be composed of first etch stop layer 108 and first mandrel layer 106.

Module 86: First Spacer Formation. (FIGS. 7-9)

This Module Details the Steps Required to Form First Spacers on Sidewalls of the Mandrels 118

Figure 7:
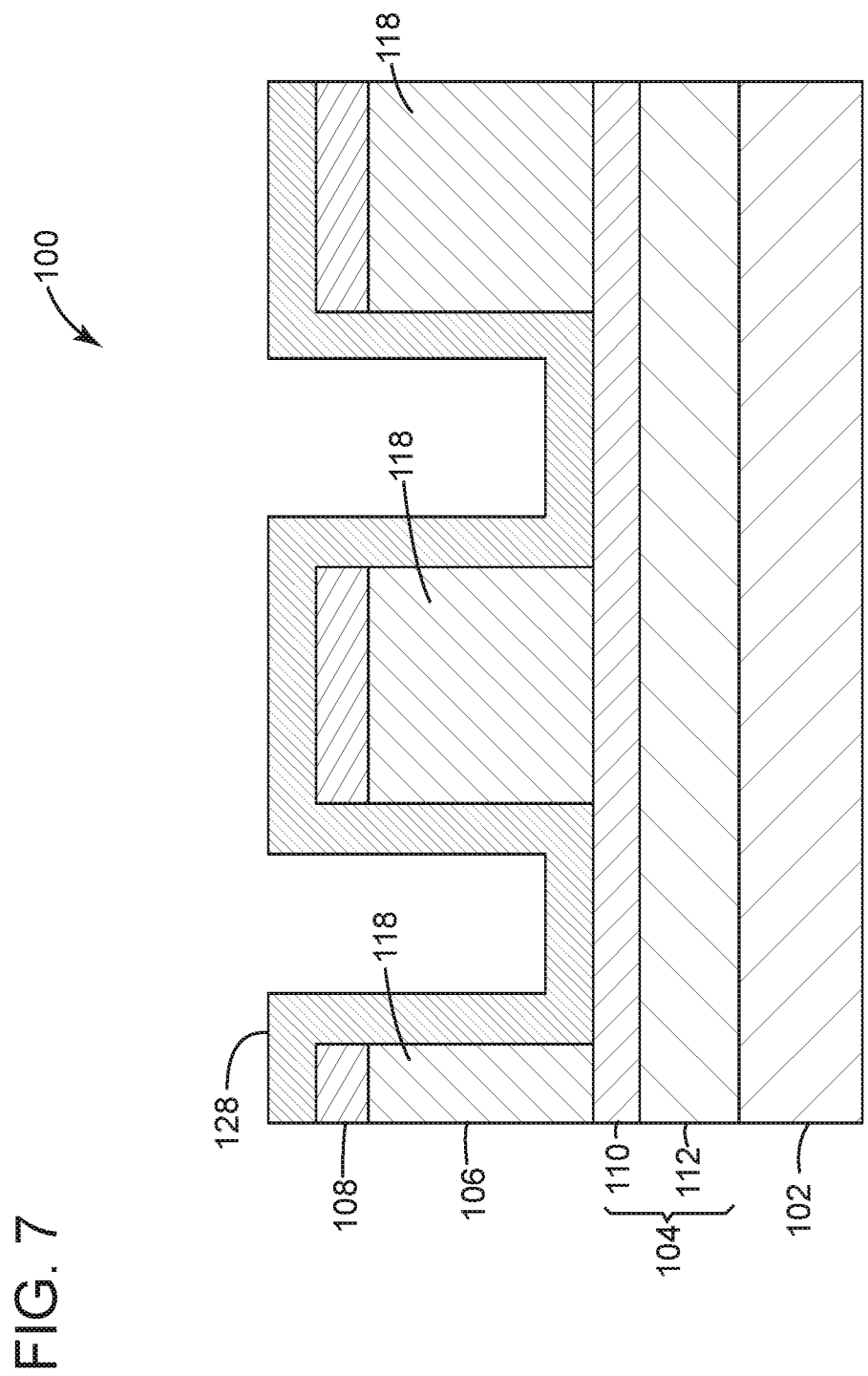
FIG. 7 is a side view of FIG. 6 having the first mandrels conformally coated with a first spacer layer in accordance with the present invention.

Referring to FIG. 7, a first spacer layer 128 is conformally coated over first mandrels 118. The first spacer layer may be an oxide layer (such as SiO2) and may be coated over the first mandrels 118 by an atomic layer deposition (ALD) process.

Figure 8:
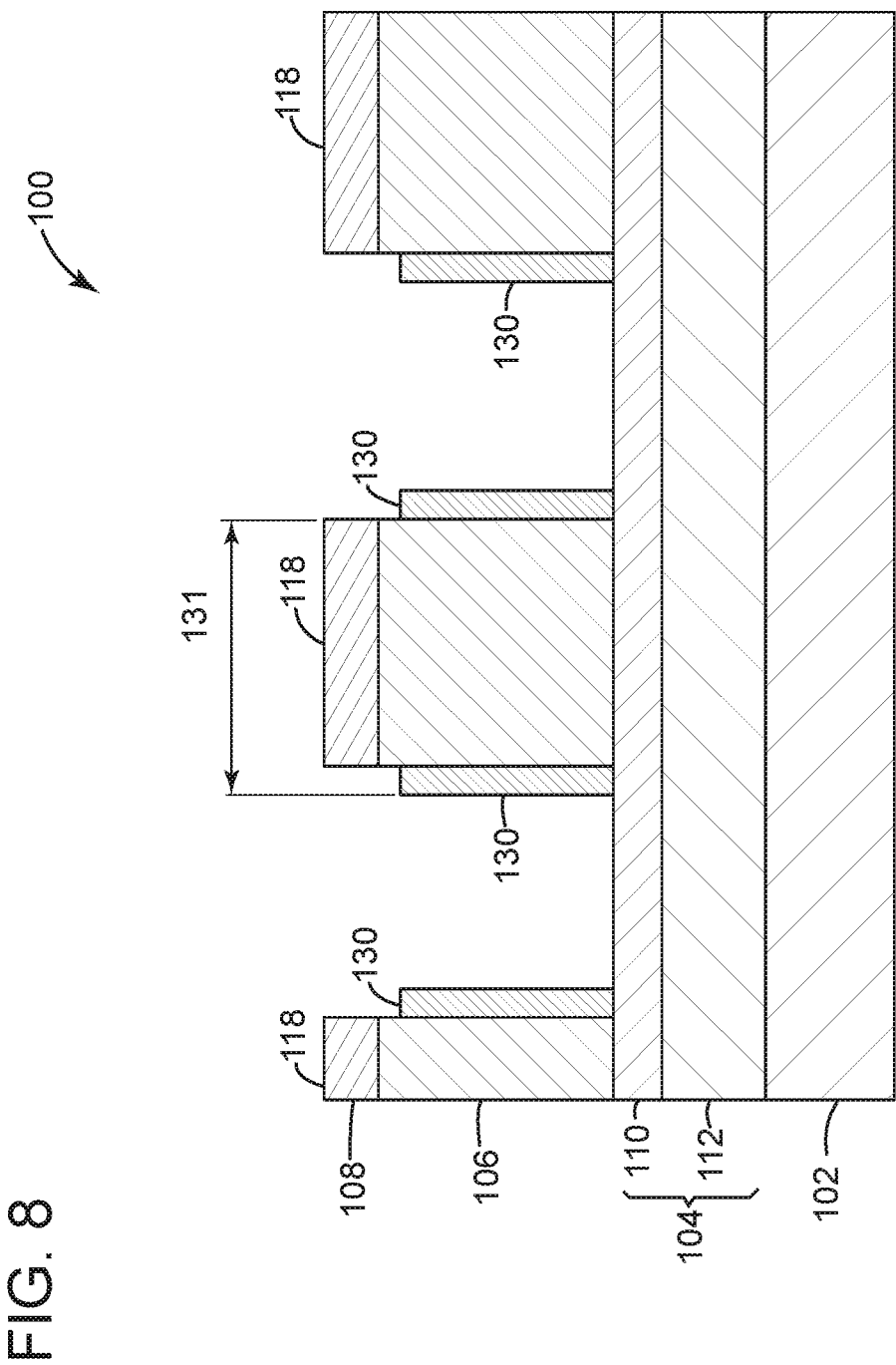
FIG. 8 is a side view of FIG. 7 having first spacers formed on sidewalls of the first mandrels in accordance with the present invention.
Figure 9:
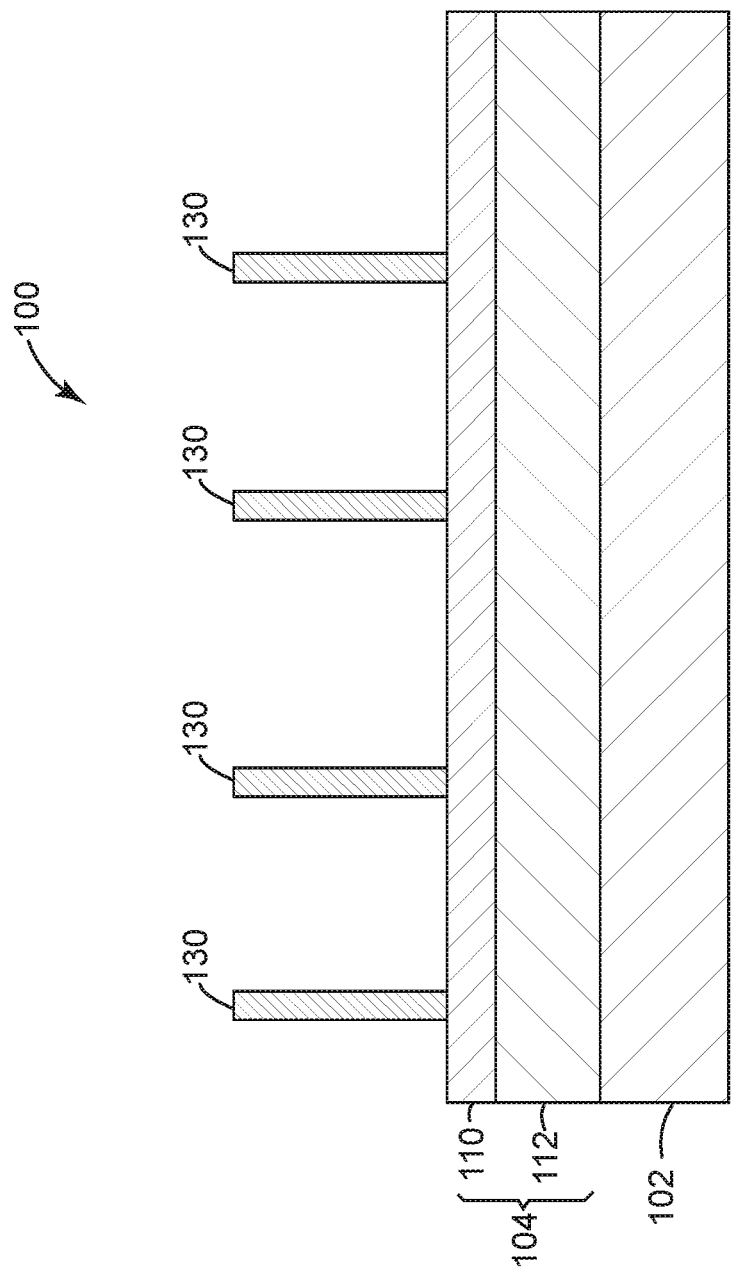
FIG. 9 is a side view of FIG. 8 having the first mandrels removed in accordance with the present invention.

Referring to FIG. 8, the first spacer layer 128 is anisotropically etched to form first spacers 130 on sidewalls of the first mandrels 118. Since there are two spacers 130 for every mandrel 118, the average pitch 131 between the first spacers 130 is half of the pitch 127 (best seen in FIG. 5) between the first mandrels 118.

Referring to FIG. 9, the first mandrels 118 are then removed, leaving just the first spacers 130 disposed on the hardmask layer 104. The removal of the mandrels 118 can be done with anyone of several well-known processes, such as a wet etching process, a RIE process or similar.

Additionally, even though FIGS. 8 and 9 are shown as two separate steps, the same process can often do both. For example, a RIE etch process can be employed to first etch the first spacers 130 with a first type of gas, then a second type of gas may be introduced during the same process to remove the first mandrels 118.

Figure 11:
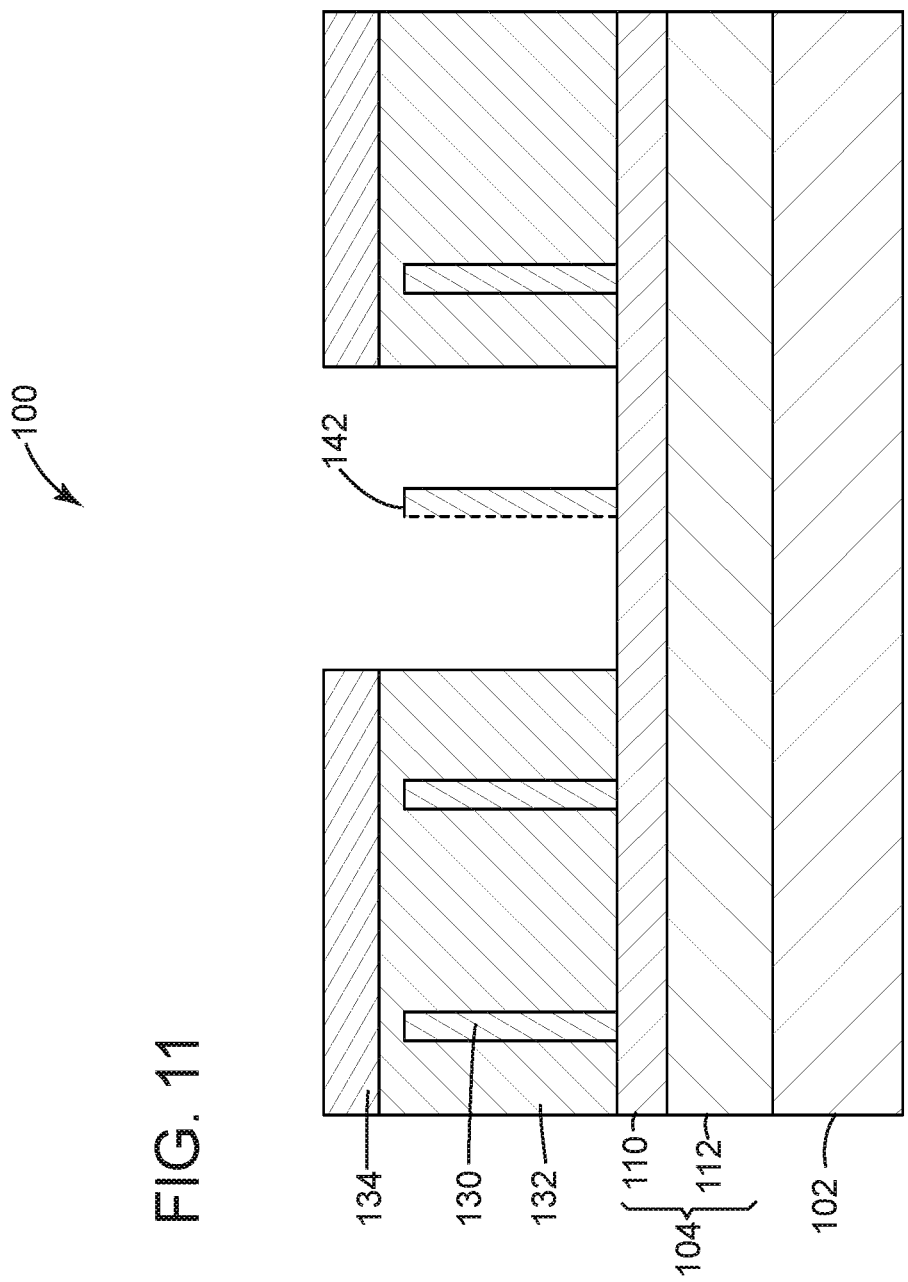
FIG. 11 is a side view of FIG. 10A having a selected section of a first spacer exposed and removed in accordance with the present invention.

Module 88 (Optional): First Cut Formation. (FIGS. 10A-11)

This Optional Module Details a Method of Etching at Least a First Cut into the First Spacers 130

Referring to FIGS. 10A and 10B, a first planarization layer 132 is disposed over the array of first spacers 130, and a second etch stop layer 134 is disposed over the first planarization layer 132.

The first planarization layer 132 can be composed of the same SOH materials as the first mandrel layer 106 (e.g., amorphous carbon or amorphous silicon). As such, it is possible that the first mandrels 118 need not be removed prior to disposing the first planarization layer 132. However, because the mandrels 118 may be hardened or damaged somewhat during processing, it is desirable to fully remove the first mandrels 118 and start with a freshly deposited planarization layer 132.

A second BARC layer 136 and a second photo resist layer 138 are then disposed over the second etch stop layer 134. The photo resist layer 138 and BARC layer 136 are then patterned to expose at least one targeted section 139 of the second etch stop layer 134. As can be seen best in FIG. 10 B, in this particular embodiment, the photo resist layer 138 and the BARC layer 136 have been patterned to expose two targeted sections 139.

Referring to FIG. 11, the second etch stop layer 134 and first planarization layer 132 are then patterned to expose at least a selected section 142 (in this specific embodiment there are two selected sections 142) of a first spacer 130 of the array of first spacers 130. At least a first cut 143 (in this case there are a pair of first cuts 143, which are best seen in the fin pattern 180 of FIG. 23) is then etched into the exposed selected section 142 of the first spacer 130 to remove the exposed selected section 142.

In this embodiment, the pair of first cuts 143 (the removed selected sections 142) divides the targeted first spacer 130 into three spacer portions. The targeted spacer may later be used to form a p-type fin for a p-type FinFET or similar p-type semiconductor device. Additionally, the first cut 143 could be a plurality of cuts on a plurality of spacers having a variety of different lengths. It is important to note that at this scale the pitch size (in this case 64 nm) is large enough to allow for lithographic patterning of a single exposed spacer 130 without clipping an adjacent spacer.

Module 90: Stack Rebuild. (FIG. 12)

This Module Details Rebuilding the Stacked Layers to Include a Second Mandrel Layer 148

Figure 12:
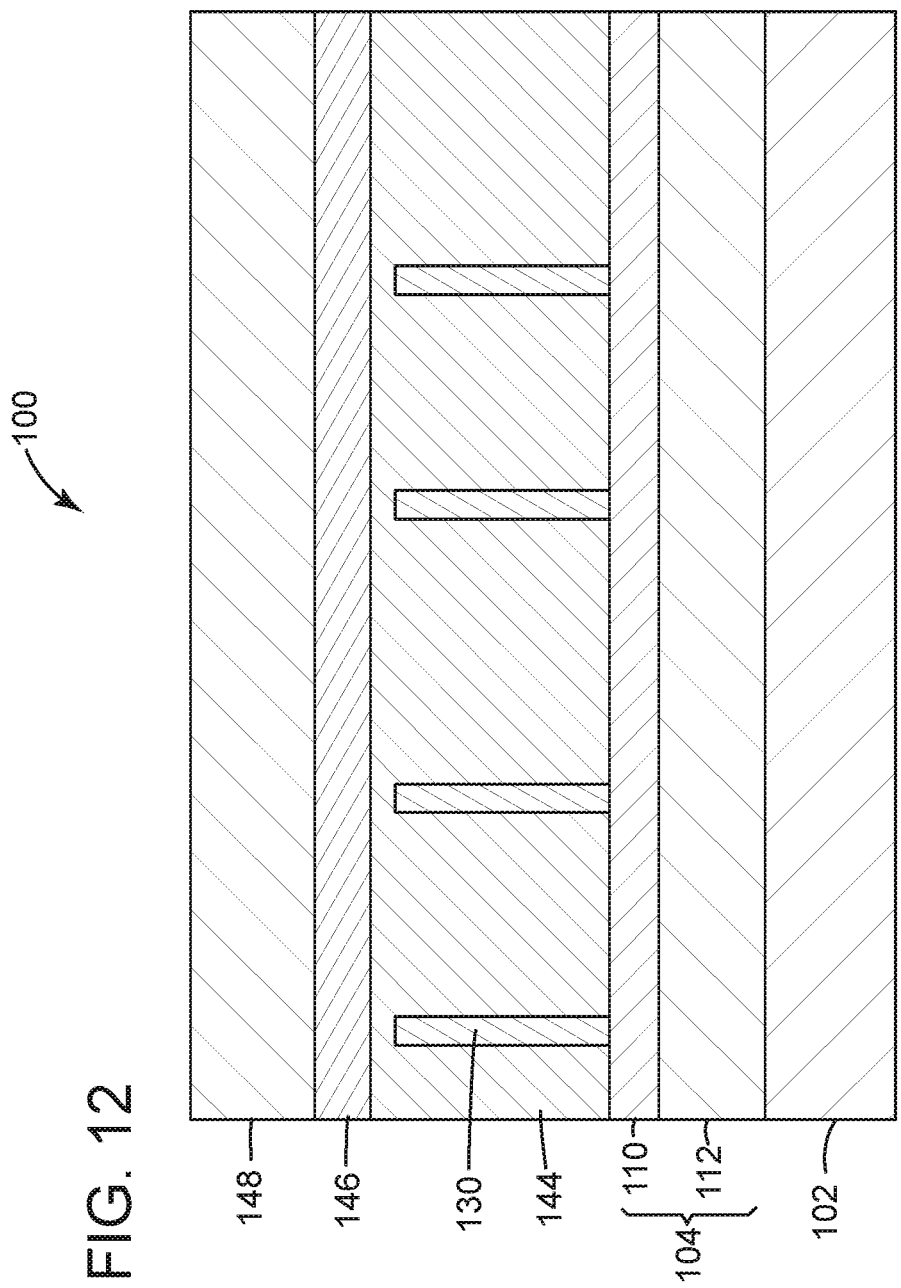
FIG. 12 is a side view of FIG. 11 having the first planarization layer removed, a pattern layer disposed over the first spacers and a second mandrel layer disposed thereon in accordance with the present invention.

Referring to FIG. 12, the first planarization layer 132 and second etch stop layer 134 are removed by well-known processes to expose the array of first spacers 130. Then a freshly planarized pattern layer 144 is disposed over the array of first spacers 130. A third etch stop layer 146 is disposed over the pattern layer 144 and a second mandrel layer 148 is disposed over the third etch stop layer 146. The pattern layer 144 and second mandrel layer 148 may be amorphous silicon, amorphous carbon or similar. The third etch stop layer 146 may be a SiON or similar.

Module 92: Second Mandrel Patterning. (FIGS. 13-14)

This Module Details the Patterning of an Array of Second Mandrels 154 into the Second Mandrel Layer 148

Figure 13:
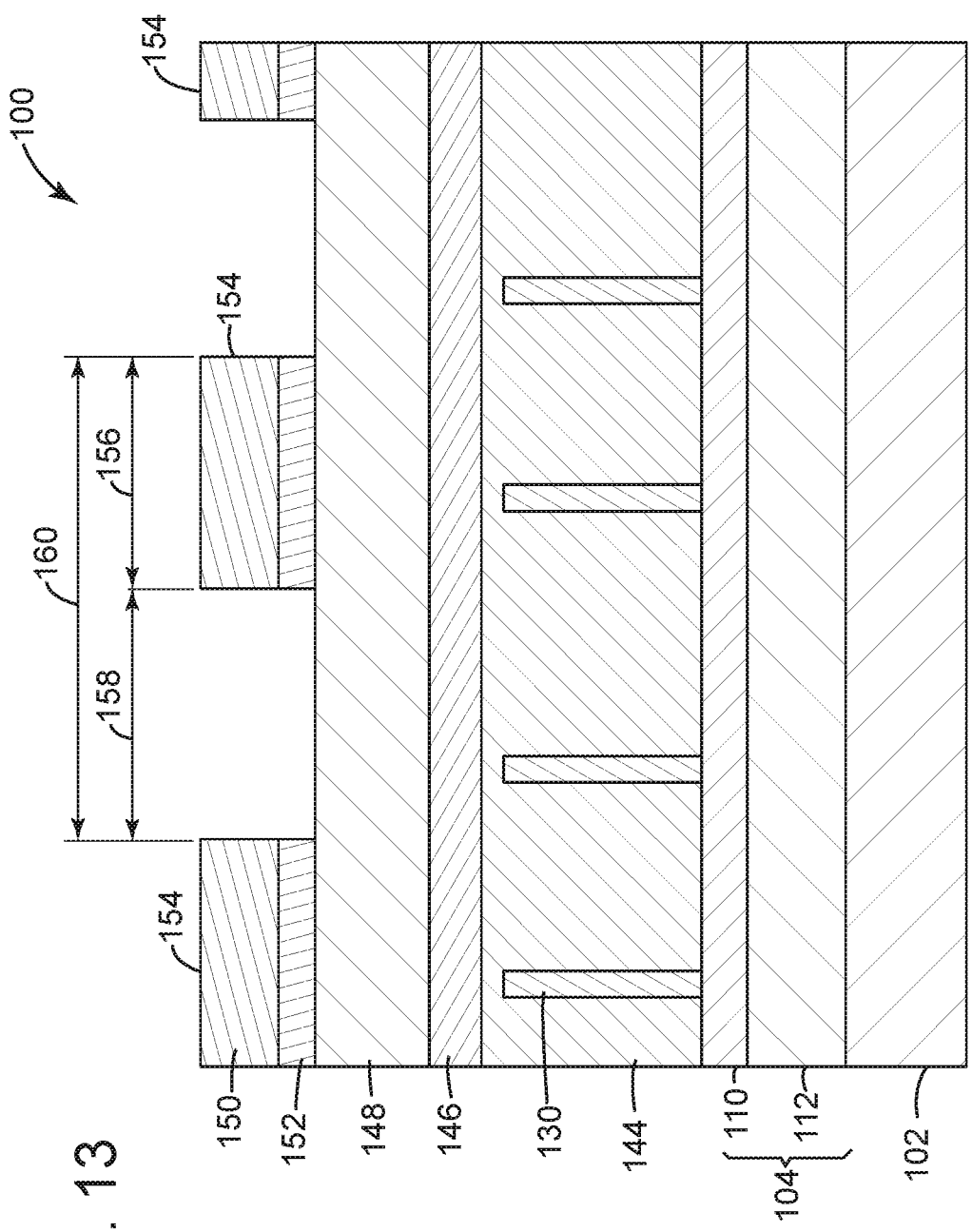
FIG. 13 is a side view of FIG. 12 having second mandrels patterned thereon in accordance with the present invention.
Figure 14:
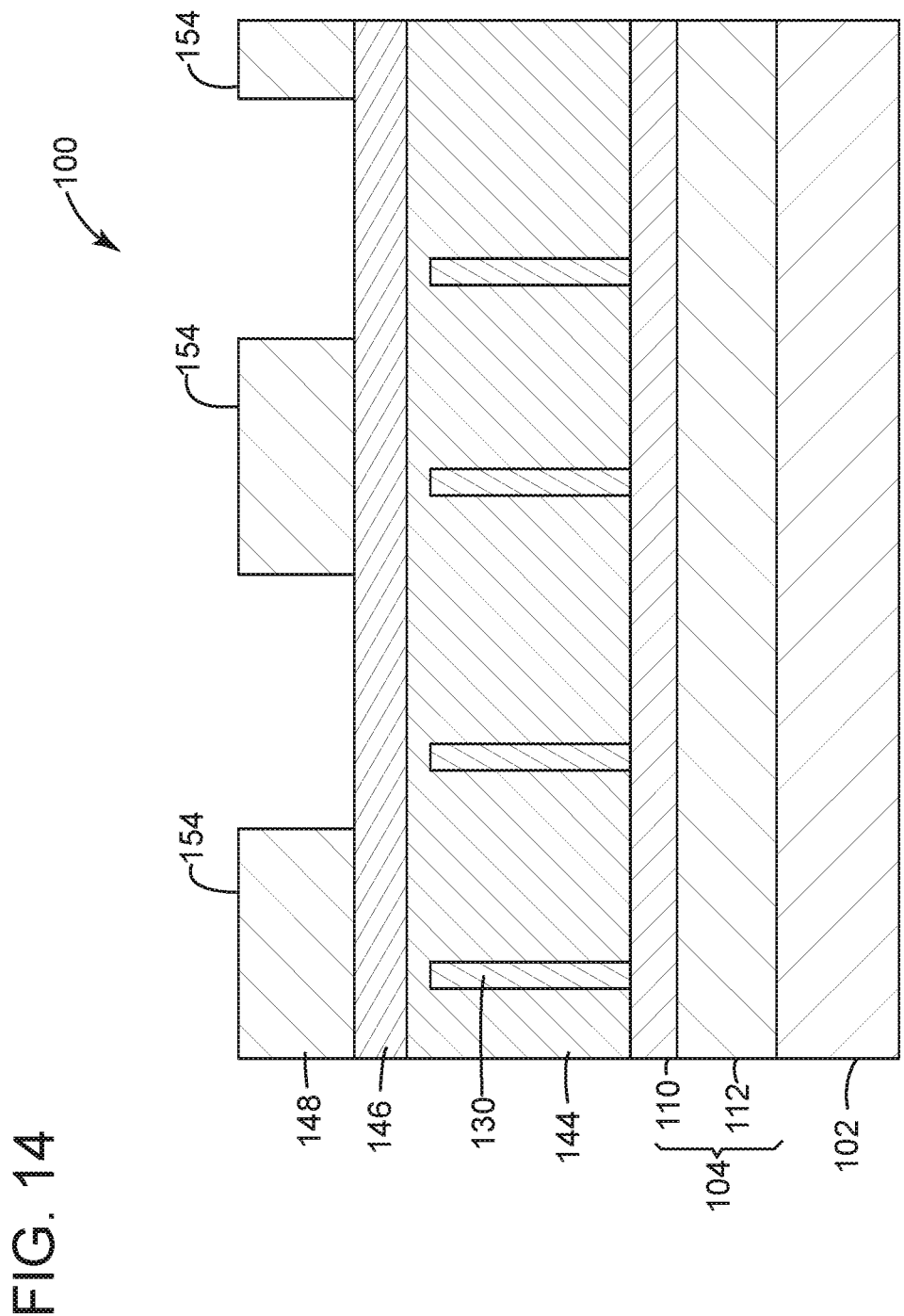
FIG. 14 is a side view of FIG. 13 having the second mandrels etched into the second mandrel layer in accordance with the present invention.

Referring to FIG. 13, a third photo resist layer 150, and optionally a third BARC layer 152, are disposed over the second mandrel layer 148. Second mandrels 154 are then patterned into the third photo resist layer 150 through well-known lithographic techniques.

In this embodiment, the second mandrels 154 have a second mandrel width 156 of 64 nm and a second mandrel spacing 158 of 64 nm for an average second mandrel pitch 160 of 128 nm. However, it is important to note that the second mandrel width 156 and spacing 158 are variable parameters that can be used to control variable spacing within a fin array of a semiconductor cell. As such, the second mandrels 154 do not have to be equally spaced or have equal widths. It is also important to note that the position of the second mandrels 154 relative the position of the original first mandrels 118 is also a variable parameter that can be useful in controlling spacing between the fins of a semiconductor cell.

Advantageously, when comparing the present invention to a conventional SAQP process as described with reference to prior art FIG. 1, it can be seen that a conventional SAQP process has only two variable parameters to control fin spacing whereas the present invention has as many as five variable parameters to do the same. That is, in a conventional SAQP process, the two variable parameters are the width of the single array of mandrels and the spacing between the single array of mandrels.

By way of contrast, in the present invention, the first mandrel width 124 and the first mandrel spacing 126 of the first mandrels 118, the second mandrel width 156 and the second mandrel spacing 158 of the second mandrels 154, and the relative position between the first 118 and second 154 mandrels are a set of five variable parameters. That set of five variable parameters may be utilized to provide variable fin spacing between fins of an array of fins for a semiconductor cell.

As a result, a process in accordance with the present invention provides much more continuous and cost effective variability for the spacing between fins of a semiconductor cell. The invention also maintains this variability even at small scales, such as with spacing between fins being 24 nm or less, with fins having widths of 8 nm or less (wherein the fin widths having a tolerance of plus or minus 4 nm or less) and with fin arrays having a pitch of 32 nm or less. Additionally, the need for dummy fins is avoided.

Moreover, the invention maintains variability in arrays of five fins or greater. This is because, unlike a prior art SAQP method wherein every other space in the array is a non-variable beta space (like the beta spaces 34 illustrated in FIG. 2), the five variable parameters of the present invention provide continuous variability to virtually every space in the array.

Referring to FIG. 14, next the second mandrels 154 are anisotropically etched into the second mandrel layer 148. The anisotropic etching process can be a reactive ion etching process.

Module 94: Second Spacer Formation. (FIGS. 15-17)

This Module Details the Formation of an Array of Second Spacers in Sidewalls of the Second Mandrels 154

Figure 15:
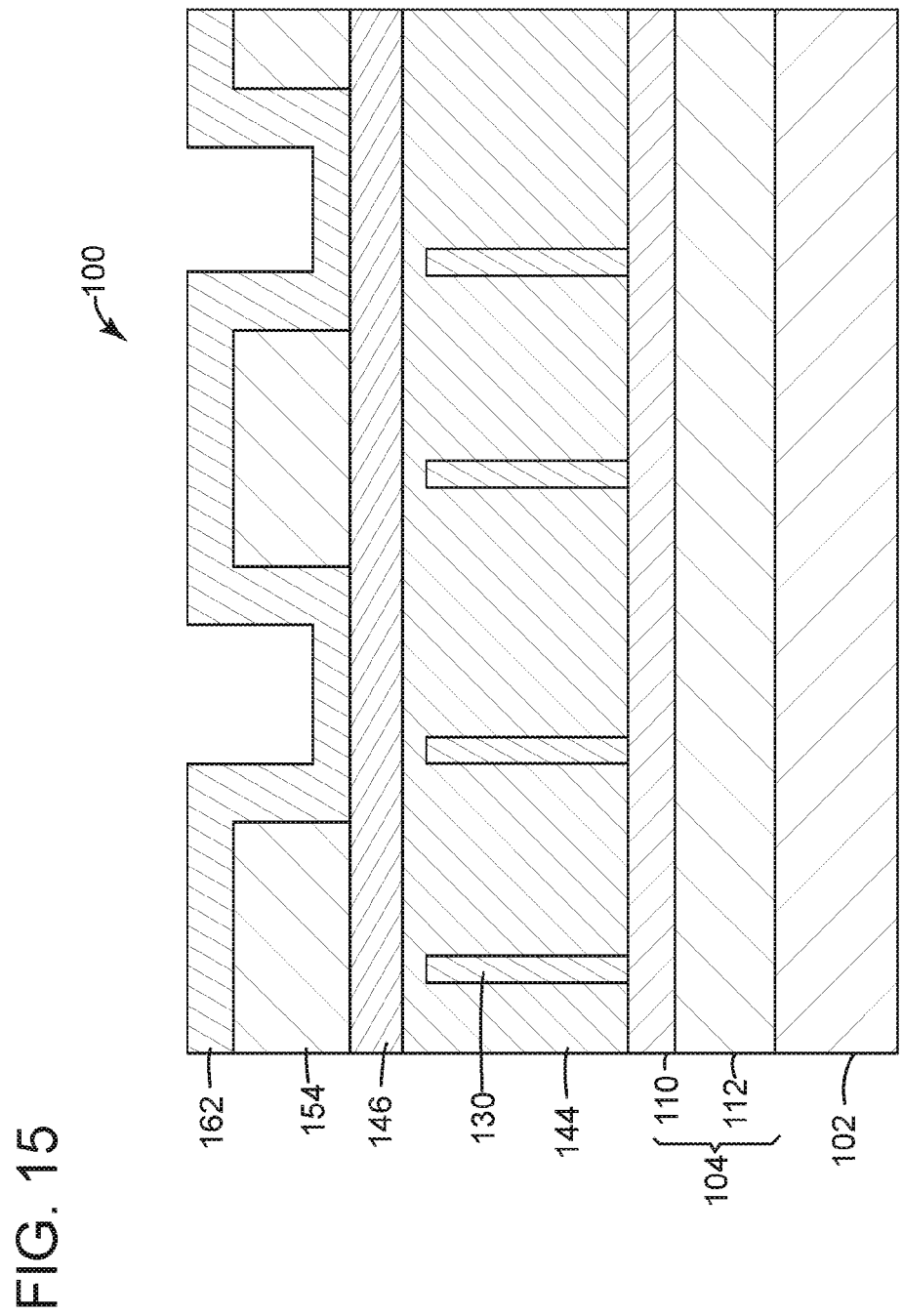
FIG. 15 is a side view of FIG. 14 having the second mandrels conformally coated with a second spacer layer in accordance with the present invention.

Referring to FIG. 15, a second spacer layer 162 is conformally coated over second mandrels 154. The second spacer layer 162 may be an oxide layer (such as SiO2) and may be coated over the second mandrels 154 by an atomic layer deposition (ALD) process.

Figure 16:
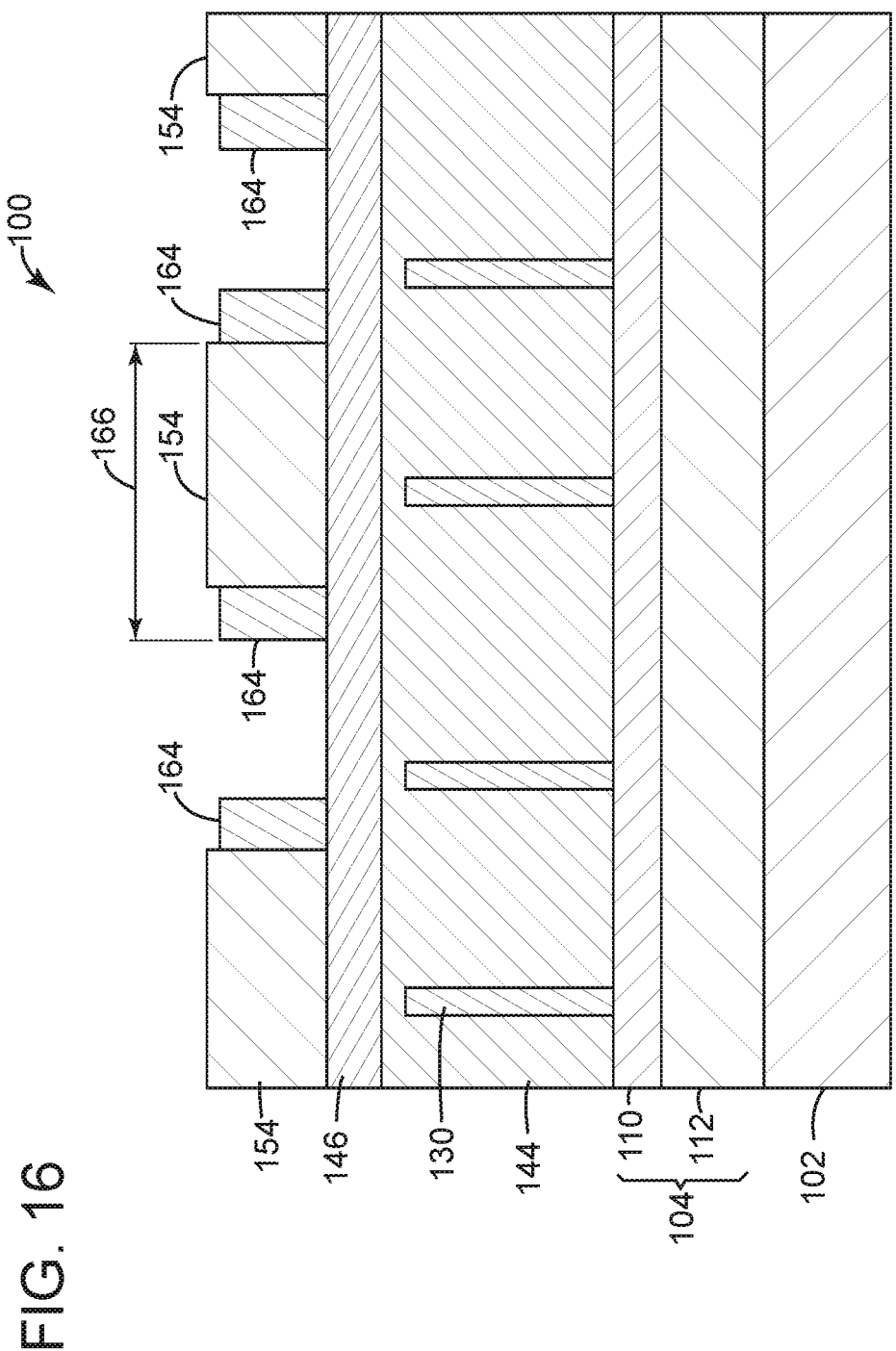
FIG. 16 is a side view of FIG. 15 having second spacers formed on sidewalls of the second mandrels in accordance with the present invention.
Figure 17:
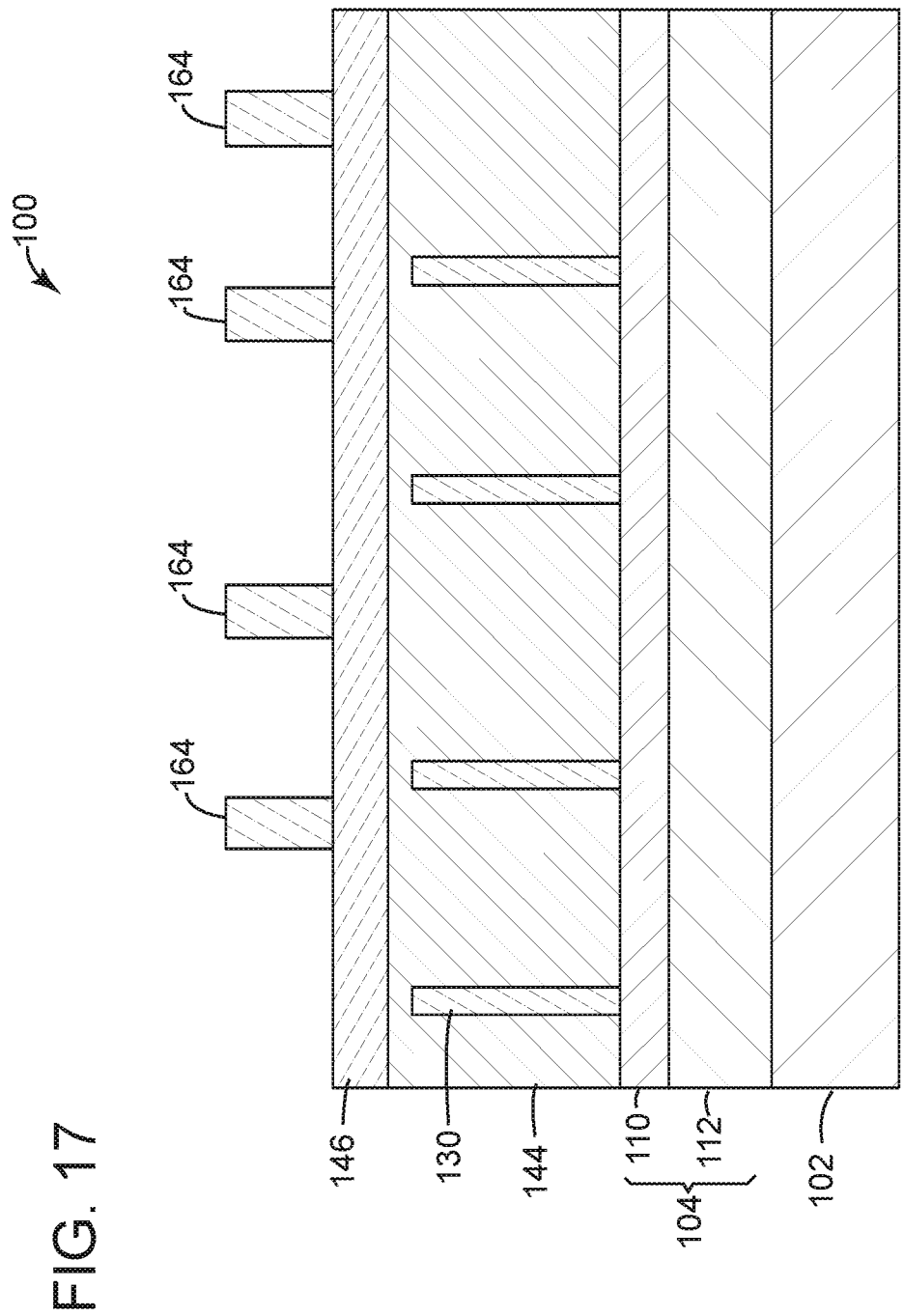
FIG. 17 is a side view of FIG. 16 having the second mandrels removed in accordance with the present invention.

Referring to FIG. 16, the second spacer layer 162 is anisotropically etched to form second spacers 164 on sidewalls of the second mandrels 154. Since there are two second spacers 164 for every second mandrel 154, the average pitch 166 between the second spacers 164 is half of the pitch 160 (best seen in FIG. 13) between the second mandrels 154.

Referring to FIG. 17, the second mandrels 154 are then removed, leaving just the second spacers 164 disposed on the third etch stop layer 146. The removal of the mandrels 154 can be done with anyone of several well-known processes, such as a wet etching process, a RIE process or similar.

Additionally, even though FIGS. 16 and 17 are shown as two separate steps, the same process can often do both. For example, a RIE etch process can be employed to first etch the second spacers 164 with a first type of gas, then a second type of gas may be introduced during the same process to remove the second mandrels 154.

Figure 18:
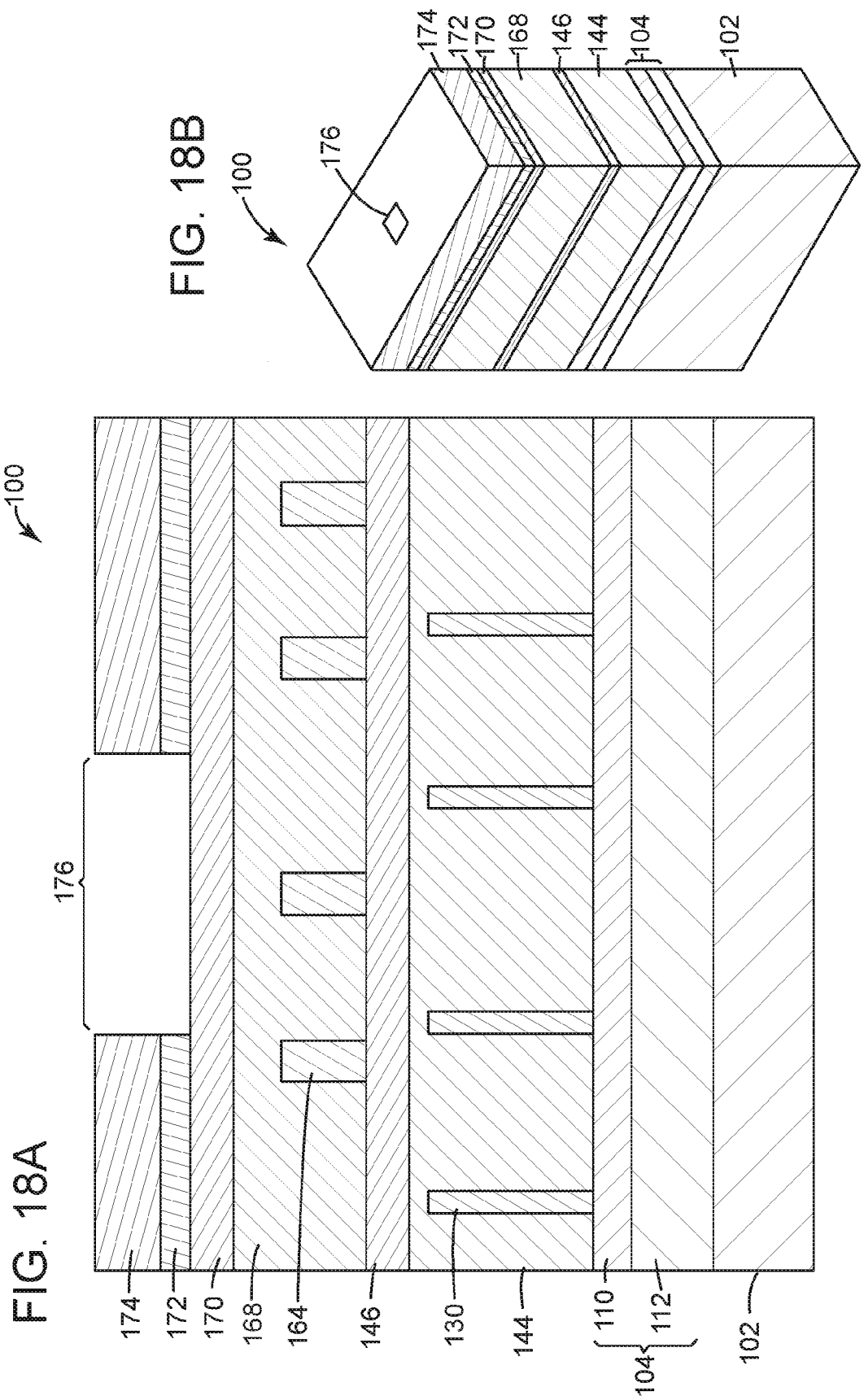
FIG. 18A is a side view of FIG. 17 having a second planarization layer, a fourth etch stop layer and a second photo resist layer disposed thereon, wherein a targeted section of the fourth etch stop layer is exposed in accordance with the present invention.
FIG. 18B is a perspective view of FIG. 18A in accordance with the present invention.
Figure 19:
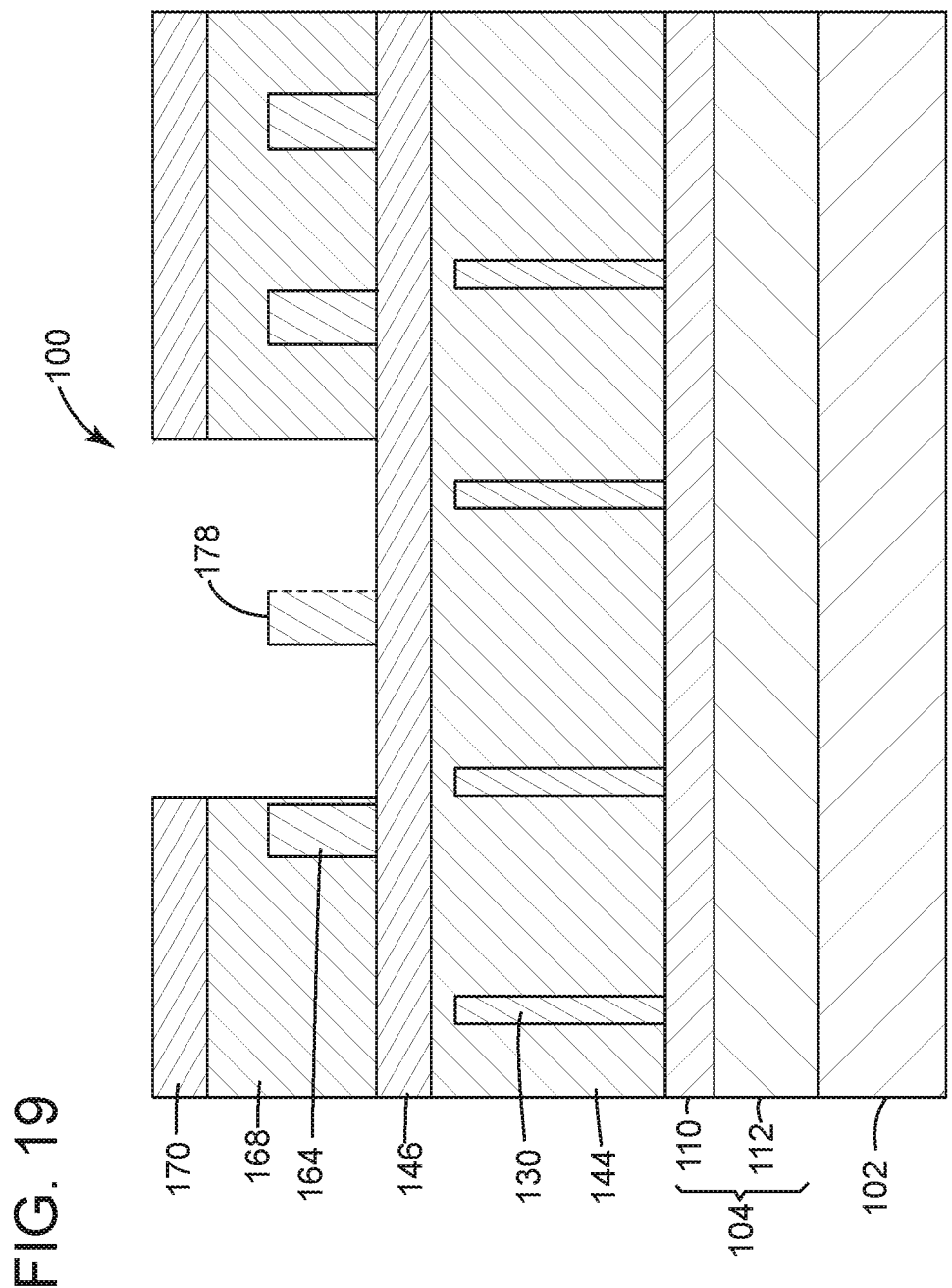
FIG. 19 is a side view of FIG. 18A having a selected section of a second spacer exposed and removed in accordance with the present invention.

Module 96 (Optional): Second Cut Formation. (FIGS. 18A-19)

This Optional Module Details a Method of Etching at Least a Second Cut into the Second Spacers 164

Referring to FIGS. 18A and 18B, a second planarization layer 168 is disposed over the array of second spacers 164, and a fourth etch stop layer 170 is disposed over the second planarization layer 168.

The second planarization layer 168 can be composed of the same SOH materials as the second mandrel layer 148 (e.g., amorphous carbon or amorphous silicon). As such, it is possible that the second mandrels 154 need not be removed prior to disposing the second planarization layer 168. However, because the second mandrels 154 may be hardened or damaged somewhat during processing, it is desirable to fully remove the mandrels 154 and start with a freshly deposited second planarization layer 168.

A fourth BARC layer 172 and a fourth photo resist layer 174 are then disposed over the fourth etch stop layer 170. The fourth photo resist layer 174 and fourth BARC layer 172 are then patterned to expose at least one targeted section 176 of the fourth etch stop layer 170.

Referring to FIG. 19, the fourth etch stop layer 170 and second planarization layer 168 are then patterned to expose at least a selected section 178 of a second spacer 164 of the array of second spacers 164. At least a second cut 179 (best seen in the fin pattern 180 of FIG. 23) is then etched into the exposed selected section 178 of the second spacer 164 to remove the exposed selected section 178.

In this embodiment, the second cut 179 (the removed section 178) divides the targeted second spacer 164 into two spacer portions. The targeted spacer 164 may later be used to form a p-type fin for a p-type FinFET or similar p-type semiconductor device. Additionally, the second cut could be a plurality of cuts on a plurality of spacers having a variety of different lengths.

It is important to note that at this scale the pitch size (in this case 64 nm) is large enough to allow for lithographic patterning of a single exposed spacer 164 without clipping an adjacent spacer. It is also important to note that the first cut 143 (the removed selected section 142 of first spacer 130) and the first array of spacers 130 are preserved by the third etch stop layer 146. Furthermore, the methods described in modules 88 and 96 of forming the first cuts 143 and second cuts 179 respectively, enables the ability to cut a single fin in a sea of fins without damaging neighboring fins even for fin pitches of 32 nm or less.

Module 98: Patterning of Fins into Substrate. (FIGS. 20-23)

This Module Details the Interleaving of the First 130 and Second 164 Spacers to Form a Pattern in the Pattern Layer 144, and the Subsequent Use of that Pattern to Etch Fins into the Substrate 102

Figure 20:
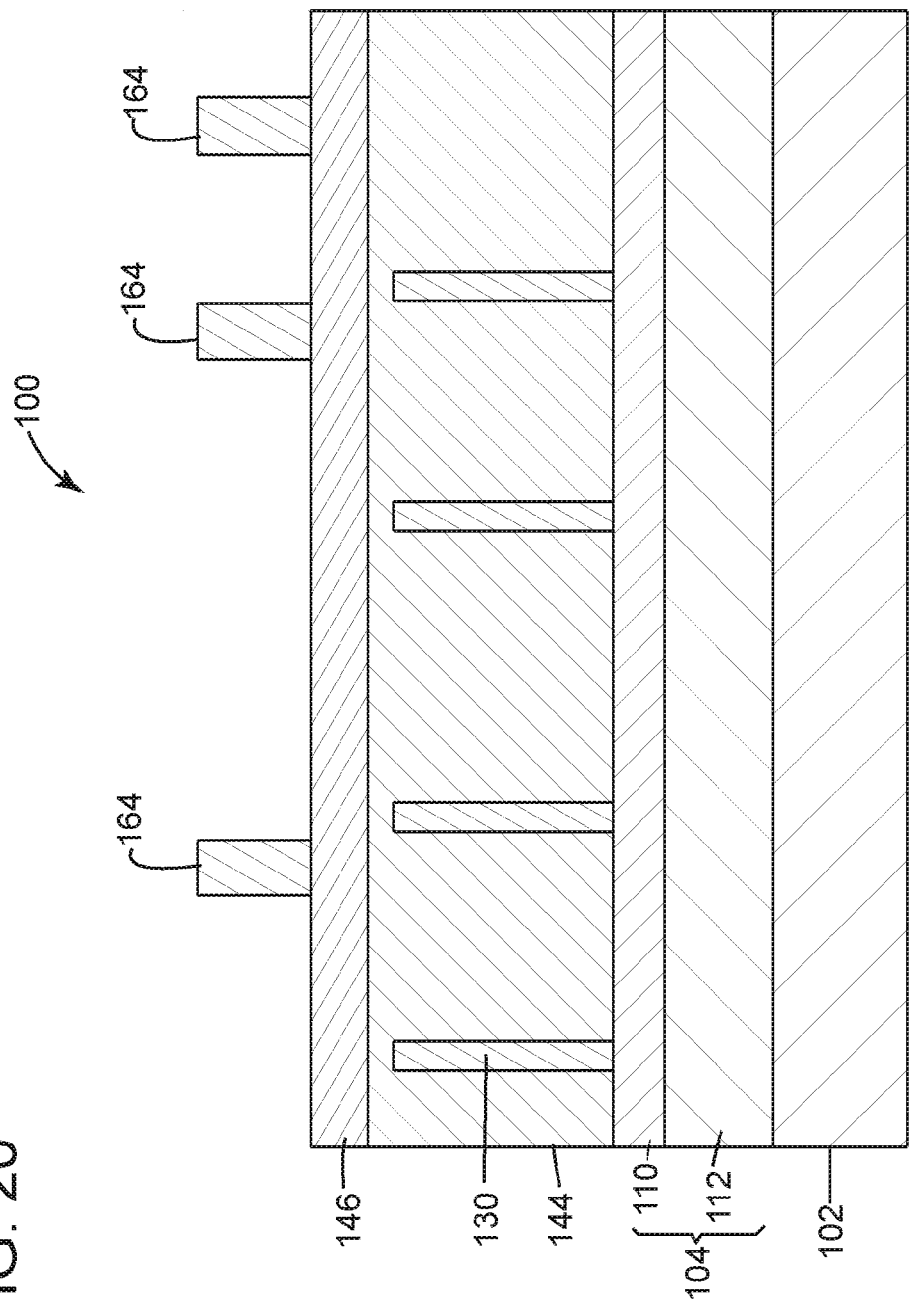
FIG. 20 is a side view of FIG. 19 having the second planarization layer removed in accordance with the present invention.

Referring to FIG. 20, the second planarization layer 168 and fourth etch stop layer 170 are then removed, leaving just the second spacers 164 disposed on the third etch stop layer 146. The removal of the second planarization layer 168 and fourth etch stop layer 170 can be done with anyone of several well-known processes, such as a wet etching process, a RIE process or similar.

Figure 21:
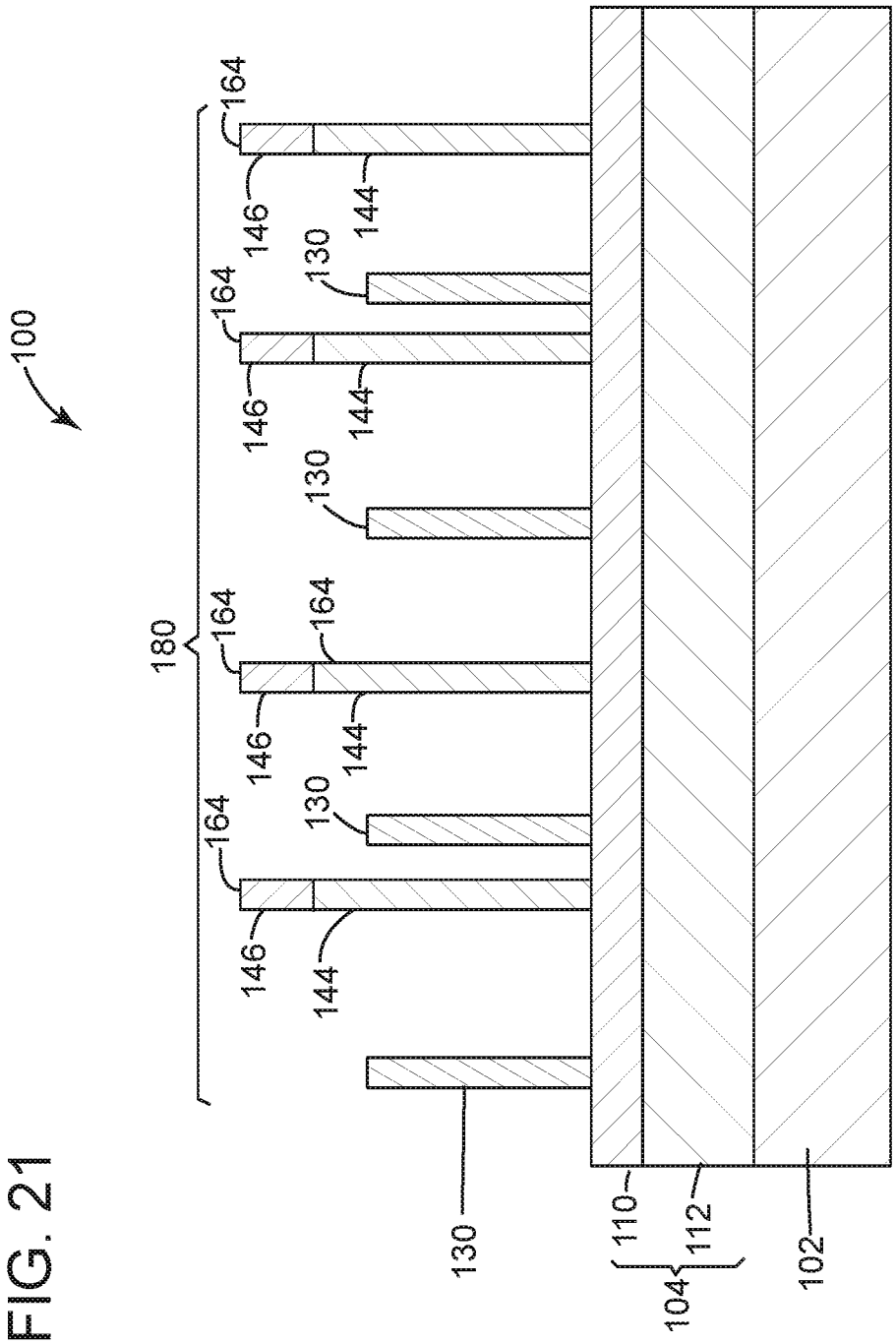
FIG. 21 is a side view of FIG. 20 having the second spacers etched into the pattern layer to form a fin pattern in accordance with the present invention.

Referring to FIG. 21, next the array of second spacers 164 are anisotropically etched into the pattern layer 144 such that the second spacers 164 are combined with the first spacers 130. The first 130 and second 164 spacers now forming a fin pattern 180 for an array of fins disposed on the hardmask layer 104. The anisotropic etching process can be a reactive ion etching process. For purposes of clarity, the second spacers 164 now etched onto the pattern layer 144 and disposed over the hardmask layer 104 are referred to as such because they have the same form and function as the original second spacers 164, which were disposed over the third etch stop layer 146. However, it is well known that, by virtue of the anisotropic etching process, the second spacers 164 now on the hardmask layer 104 are a translation of the original second spacers 164 and will be composed of remnants of the various layers involved in the etching process. More specifically, the second spacers 164 now on the hardmask layer 104 may be composed of remnants of the original second spacers 164, the third etch stop layer 146 and the pattern layer 144.

It is important to note that the first 130 and second 164 spacers may be combined in several different ways to form the fin pattern 180. By way of example, but not limitation, the first 130 and second 164 spacers may be interleaved, alternated, arranged in specific groups or any combination thereof. Furthermore, the first 130 and second 164 spacers may be combined to form fin patterns 180, which range in size from as small as two fins to several hundreds of fins and larger.

Figure 22:
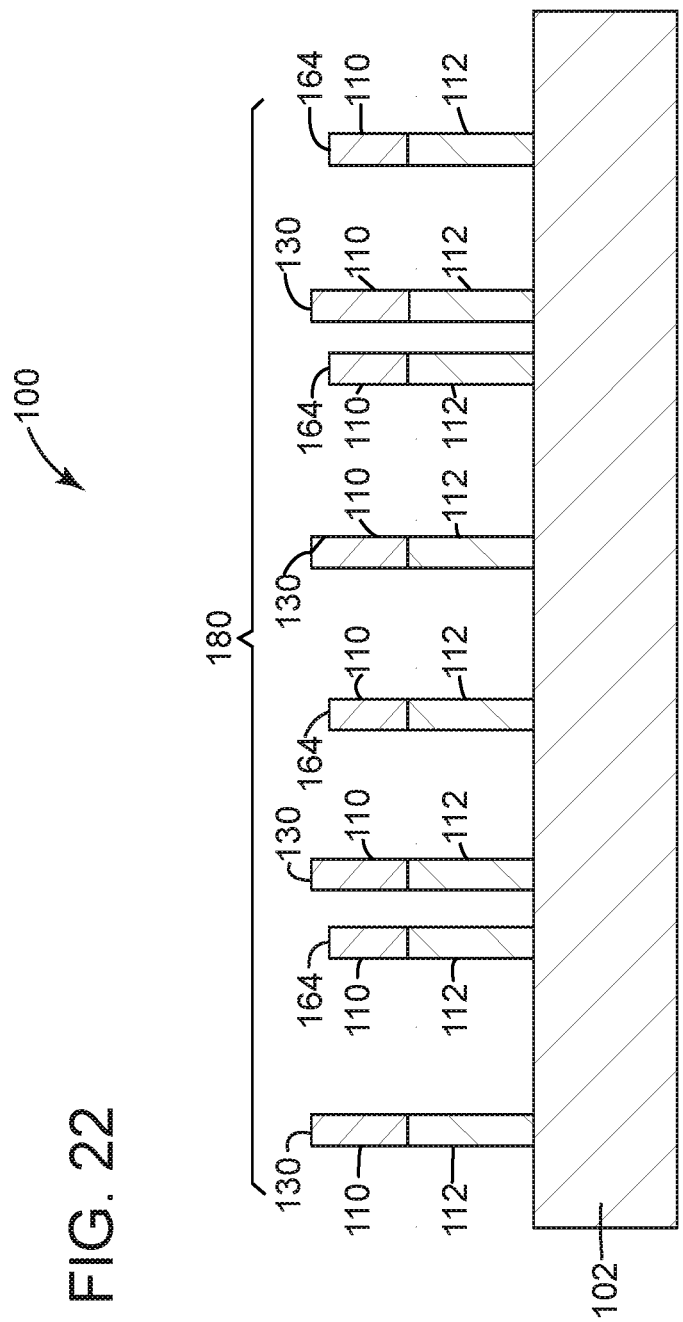
FIG. 22 is a side view of FIG. 21 having the fin pattern etched into the hardmask layer in accordance with the present invention.

Referring to FIG. 22, next the fin pattern 180 is anisotropically etched down through the two sublayers 110, 112 of hardmask layer 104. The pattern is now disposed on substrate 102 and ready to be utilized for fin formation into substrate 102.

Figure 23:
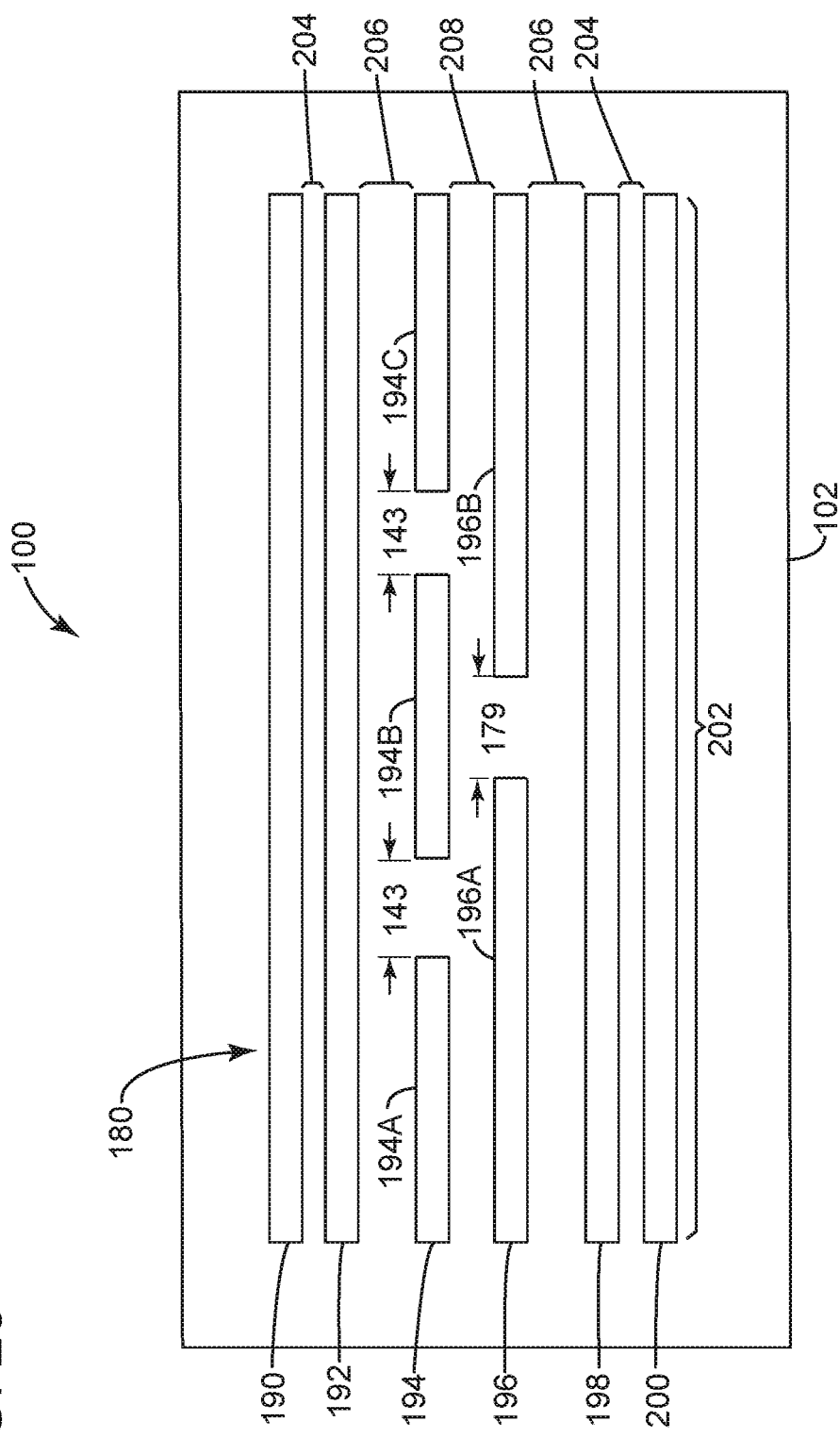
FIG. 23 is a top view of FIG. 22 having the pattern etched into the substrate to form an SRAM cell in accordance with the present invention.

Referring to FIG. 23, a top view of the fin pattern 180 etched into substrate 102 to form an array of fins 190, 192, 194, 196, 198 and 200 (i.e., 190-200) is shown. In this embodiment, the array of fins 190-200 form a semiconductor SRAM cell 202.

SRAM cell 202 is similar to prior art SRAM cell 40 in that there are alternating pairs of n-type fins and pairs of p-type fins. Specifically, fins 190, 192, 198 and 200 are n-type fins, while fins 194 and 196 are p-type fins. Additionally, cuts 143 are disposed in p-type fin 194, which divides fin 194 into three fin portions 194A, 194B and 194C. Also, cut 179 is disposed in p-type fin 196, which divides fin 196 into two fin portions 196A and 196B. All fins 190-200 have an equal fin width. In this particular embodiment, the fin width is set at 8 nm with a tolerance of plus or minus 4 nm or less.

Like prior art SRAM cell 40, the minimum spacing distance 204 is the n-to-n distance between the pairs of n-type fins, which is set at 24 nm for this particular embodiment. That is, there is a minimum spacing distance of 24 nm between the n-type fin pairs 190/192 and 198/200. The n-to-p distance, that is the distance 206 between adjacent pairs of n-type and p-type fins 192/194 and 196/198 must be larger than the minimum spacing distance 204.

However, unlike prior art SRAM cell 40, none of the spaces between fins 190-200 of SRAM cell 202 are fixed. This is due to the set of five variable parameters utilized to provide variable fin spacing between any of the fins 190-200 of SRAM cell 202. As discussed with particularity with reference to module 92, those five variable parameters are:
a. the first mandrel width 124 of the first mandrel 118;
b. the first mandrel spacing 126 of the first mandrels 118;
c. the second mandrel width 156 of the second mandrels 154;
d. the second mandrel spacing 158 of the second mandrels 154; and
e. the relative position between the first 118 and second 154 mandrels.

As a result, the n-to-p distance in SRAM cell 202 can be set smaller than that of prior art SRAM cell 40. More specifically, because SRAM cell 40 must achieve its variability of fin spacing through the formation and removal of sacrificial dummy fins, the n-to-p spacing in SRAM cell 40 must be equal to or larger than the sum of the fin width plus twice the minimum spacing distance (which in this exemplary embodiment adds up to 56 nm plus or minus 4 nm). In contrast, the n-to-p distance 206 of SRAM cell 202 is not so restricted and can be set relatively smaller, such as 1.5 times the minimum spacing distance (which in this exemplary embodiment adds up to 36 nm).

Moreover, the p-to-p distance 208 between p-type fins 194/196 is also generally larger than the minimum spacing distance 204 between n-type fins. In prior art SRAM cell 40, because prior art SRAM cell 40 can only achieve spacing variability via dummy fin removal, that p-to-p distance would also have to be equal to or larger than the sum of the fin width plus twice the minimum spacing distance. Again, by contrast, the p-to-p distance in the SRAM cell 202 can be set relatively smaller.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
providing a structure, the structure including a hardmask layer disposed over a substrate and a first mandrel layer disposed over the hardmask layer;
patterning an array of first mandrels into the first mandrel layer;
forming an array of first spacers on sidewalls of the first mandrels;
disposing a pattern layer over the array of first spacers, an etch stop layer over the pattern layer and a second mandrel layer over the etch stop layer;
patterning an array of second mandrels into the second mandrel layer;
forming an array of second spacers on sidewalls of the second mandrels;
etching the array of second spacers into the pattern layer such that the second spacers are combined with the first spacers, the first and second spacers forming a pattern for an array of fins disposed on the hardmask layer; and
etching the pattern into the substrate to form the array of fins.

2. The method of claim 1, wherein a first mandrel width and a first mandrel spacing of the first mandrels, a second mandrel width and a second mandrel spacing of the second mandrels and a relative position between the first and second mandrel s are a set of five variable parameters, the method comprising:
utilizing the set of five variable parameters to provide variable fin spacing between fins of the array of fins.

3. The method of claim 1 comprising:
disposing a first planarization layer over the array of first spacers prior to the step of disposing of the pattern layer over the array of first spacers;
patterning the first planarization layer to expose a selected section of a first spacer of the array of first spacers; and
etching a first cut into the exposed selected section of the first spacer.

4. The method of claim 1 comprising:
disposing a second planarization layer over the second spacers prior to the step of etching the array of second spacers into the pattern layer;
patterning the second planarization layer to expose a selected second spacer of the array of second spacers; and
etching a second cut into the exposed second spacer.

5. The method of claim 1 wherein the array of fins formed by the etching step comprises:
an array of at least five substantially parallel fins having substantially equal fin widths disposed on the substrate, the array of fins including a predetermined minimum spacing distance between at least one pair of adjacent fins within the array of fins, the array of fins including:
a first n-type fin for an n-type semiconductor device, and
a first p-type fin for a p-type semiconductor device, the first p-type fin disposed adjacent the first n-type fin and spaced a predetermined first n-to-p distance apart from the first n-type fin,
wherein the first n-to-p distance is greater than the minimum spacing distance and less than the sum of the fin width plus twice the minimum spacing distance.

6. The method of claim 3 comprising removing the first mandrels prior to the step of disposing a first planarization layer.

7. The method of claim 3 comprising forming a p-type fin for a p-type semiconductor device from the first spacer.

8. The method of claim 4 comprising removing the second mandrels prior to the step of disposing a second planarization layer.

9. The method of claim 4 comprising forming a p-type fin for a p-type semiconductor device from the second spacer.

10. The method of claim 5 wherein the array of fins formed by the etching step comprises:
   a first pair of n-type fins including the first n-type fin; and
   a first pair of p-type fins including the first p-type fin;
   wherein the distance between fins of the first pair of n-type fins is substantially the minimum spacing distance, and
   wherein the distance between the first pair of n-type fins and first pair of p-type fins is the first n-to-p distance.

11. The method of claim 5 wherein:
   the minimum spacing distance is 24 nm or less; and
   the fin width is 8 nm or less, the fin width having a tolerance of no greater than plus or minus 4 nm.

12. The method of claim 9 wherein the array of fins formed by the etching step comprises an array of fins for a static random access memory (SRAM) cell.

\* \* \* \* \*